United States Patent
Oh et al.

(10) Patent No.: US 9,070,691 B2
(45) Date of Patent: Jun. 30, 2015

(54) SEMICONDUCTOR PACKAGE AND STACKED SEMICONDUCTOR PACKAGE HAVING THE SAME

(71) Applicant: SK HYNIX INC., Gyeonggi-do (KR)

(72) Inventors: Jae Sung Oh, Gyeonggi-do (KR); Moon Un Hyun, Gyeonggi-do (KR); Jong Hyun Kim, Seoul (KR); Jin Ho Gwon, Gyeonggi-do (KR)

(73) Assignee: SK HYNIX INC., Gyeonggi-do (KR)

( * ) Notice: Subject to any disclaimer, the term of this patent is extended or adjusted under 35 U.S.C. 154(b) by 0 days.

(21) Appl. No.: 14/341,288

(22) Filed: Jul. 25, 2014

(65) Prior Publication Data

US 2014/0332946 A1 Nov. 13, 2014

Related U.S. Application Data

(62) Division of application No. 13/630,239, filed on Sep. 28, 2012, now Pat. No. 8,823,158, which is a division of application No. 12/347,005, filed on Dec. 31, 2008, now Pat. No. 8,299,591.

(30) Foreign Application Priority Data

Sep. 19, 2008 (KR) .................. 10-2008-0091960

(51) Int. Cl.
*H01L 23/02* (2006.01)
*H01L 23/48* (2006.01)
(Continued)

(52) U.S. Cl.
CPC .......... *H01L 23/5386* (2013.01); *H01L 21/486* (2013.01); *H01L 21/67346* (2013.01);
(Continued)

(58) Field of Classification Search
CPC .......... H01L 2224/16225; H01L 2224/48227; H01L 2224/73265; H01L 2224/32225; H01L 2225/1023; H01L 2225/107; H01L 23/3128; H01L 23/49827; H01L 23/5384; H01L 23/5386; H01L 25/105; H01L 25/117; H01L 2924/00; H01L 2924/01087; H01L 2924/00014; H01L 21/67346; H01L 21/486; H01L 25/0657; H01L 2224/08145; H01L 2224/08111; H01L 2224/16151; H01L 2224/31; H01L 2224/32146; H01L 2224/29011; H01L 2224/29009; H01L 2224/2919; H01L 2225/06503; H01L 2225/1011; H01L 2225/06548; H01L 2925/0655; H01L 23/12; H01L 23/32; H01L 23/481; H01L 23/5226; H01L 24/63; H01L 24/65
USPC .......... 257/685, 686, 692, 698, 773, 774, 778
See application file for complete search history.

(56) References Cited

U.S. PATENT DOCUMENTS 5,796,163 A  8/1998  Glenn et al.
6,091,137 A  7/2000  Fukuda
(Continued)

OTHER PUBLICATIONS

USPTO RR mailed Dec. 22, 2010 in connection with U.S. Appl. No. 12/347,005.
(Continued)

*Primary Examiner* — Teresa M Arroyo
(74) *Attorney, Agent, or Firm* — Ladas & Parry LLP

(57) ABSTRACT

A semiconductor package includes a substrate having a substrate body possessing a first region, a second region which is defined around the first region and a third region which is defined around the second region. Wiring lines are placed on the substrate body, and the wiring lines have first ends that extend to the third region. Connection patterns are placed in the third region and are electrically connected to the first ends of the wiring lines. A to semiconductor chip is disposed in the first region and is electrically connected to the respective wiring lines, and a molding member is disposed in the first and second regions and covers the semiconductor chip.

2 Claims, 8 Drawing Sheets

(51) Int. Cl.
    *H01L 23/52*     (2006.01)
    *H01L 23/04*     (2006.01)
    *H01L 29/40*     (2006.01)
    *H01L 23/538*     (2006.01)
    *H01L 21/48*     (2006.01)
    *H01L 21/673*     (2006.01)
    *H01L 23/32*     (2006.01)
    *H01L 25/10*     (2006.01)
    *H01L 25/11*     (2006.01)
    *H01L 23/31*     (2006.01)
    *H01L 23/498*     (2006.01)

(52) U.S. Cl.
    CPC .............. *H01L23/481* (2013.01); *H01L 23/32* (2013.01); *H01L 2224/08111* (2013.01); *H01L 2224/32146* (2013.01); *H01L 2224/29009* (2013.01); *H01L 2224/29011* (2013.01); *H01L 23/3128* (2013.01); *H01L 23/49827* (2013.01); *H01L 25/105* (2013.01); *H01L 2224/16225* (2013.01); *H01L 2924/01087* (2013.01); *H01L 2225/1023* (2013.01); *H01L 2225/107* (2013.01); *H01L 23/5384* (2013.01); *H01L 25/117* (2013.01)

(56) References Cited

U.S. PATENT DOCUMENTS

| | | | |
|---|---|---|---|
| 6,157,080 A | 12/2000 | Tamaki et al. | |
| 6,188,127 B1 | 2/2001 | Senba et al. | |
| 6,350,952 B1 | 2/2002 | Gaku et al. | |
| 6,468,831 B2 | 10/2002 | Leong et al. | |
| 6,472,735 B2 | 10/2002 | Isaak | |
| 6,534,723 B1 | 3/2003 | Asai et al. | |
| 6,707,152 B1 | 3/2004 | Schrock | |
| 6,762,078 B2 | 7/2004 | Shin et al. | |
| 6,798,049 B1 | 9/2004 | Shin et al. | |
| 6,858,926 B2 | 2/2005 | Moden et al. | |
| 7,061,120 B2 | 6/2006 | Shin et al. | |
| 7,365,416 B2 | 4/2008 | Kawabata et al. | |
| 7,656,031 B2 | 2/2010 | Chen et al. | |
| 7,808,111 B2 | 10/2010 | Trezza | |
| 8,039,943 B2 | 10/2011 | Harayama et al. | |
| 2001/0054758 A1 | 12/2001 | Isaak | |
| 2002/0171137 A1 | 11/2002 | Sota | |
| 2003/0006494 A1 | 1/2003 | Lee et al. | |
| 2004/0036164 A1 | 2/2004 | Koike et al. | |
| 2006/0231939 A1 | 10/2006 | Kawabata et al. | |
| 2007/0013043 A1 | 1/2007 | Pan et al. | |
| 2007/0187810 A1 | 8/2007 | Mok et al. | |
| 2008/0067661 A1 | 3/2008 | Kawabata | |
| 2008/0157330 A1 | 7/2008 | Kroehnert et al. | |
| 2009/0108430 A1 | 4/2009 | Chung | |

OTHER PUBLICATIONS

USPTO NFOA mailed Feb. 11, 2011 in connection with U.S. Appl. No. 12/347,005.
Uspto FOA mailed Jul. 15, 2011 in U.S. Appl. No. 12/347,005.
USPTO NFOA mailed Dec. 1, 2011 in connection with U.S. Appl. No. 12/347,005.
USPTO NOA mailed Jun. 29, 2012 in connection with U.S. Appl. No. 12/347,005.
USPTO Supplemental NOA dated Aug. 14, 2012 in U.S. Appl. No. 12/347,005.
USPTO RR dated Dec. 9, 2013 in connection with U.S. Appl. No. 13/630,239.
USPTO Ex Parte Quayle dated Mar. 20, 2014 in connection with U.S. Appl. No. 13/630,239.
USPTO NOA mailed Apr. 29, 2014 in connection with U.S. Appl. No. 13/630,239.

SEMICONDUCTOR PACKAGE AND STACKED SEMICONDUCTOR PACKAGE HAVING THE SAME

CROSS-REFERENCE TO RELATED APPLICATIONS

The present application claims priority to Korean patent application number 10-2008-0091960 filed on Sep. 19, 2008, which is incorporated herein by reference in its entirety.

BACKGROUND OF THE INVENTION

The present invention relates generally to semiconductor devices, and more particularly, to a semiconductor package and a stacked semiconductor package having the same.

Today's semiconductor chips are capable of both storing and processing massive amounts of data. These semiconductor chips are packaged in semiconductor packages.

Chip scale packages have been considered to have the potential to have a size that is no greater than about 100% to 105% of the size of a semiconductor chip. Further, stacked semiconductor packages, in which two or more chip scale packages are stacked, can be utilized to increase data storage capacity and data processing speed.

In a conventional stacked semiconductor package, the respective semiconductor packages, which are stacked upon one another, and a substrate on which the semiconductor packages are placed are electrically connected using conductive wires.

However, when the semiconductor packages and the substrate are electrically connected using conductive wires there is a difference between the length of the conductive wires used to connect the lowermost semiconductor package to the substrate and the length of the conductive wires used to connect an upper semiconductor package, which is placed over the lower semiconductor package, to the substrate. As a consequence, problems arise when attempting to process data at a high speed.

SUMMARY OF THE INVENTION

Embodiments of the present invention include a semiconductor package which is suitable for processing data at a high speed.

Also, embodiments of the present invention are directed to a stacked semiconductor package having at least two semiconductor packages stacked upon each other and suitable for processing data at a high speed.

In one aspect of the present invention, a semiconductor package comprises a substrate having a substrate body possessing a first region, a second region which is defined around the first region and a third region which is defined around the second region, wiring lines placed on the substrate body and having first ends which extend to the third region, and connection patterns placed in the third region and electrically connected with the first ends of the wiring lines; a semiconductor chip placed in the first region and electrically connected with the respective wiring lines; and a molding member placed in the first and second regions and covering the semiconductor chip.

The respective connection patterns are placed on inner surfaces of the substrate body, which are formed by through-holes that pass through an upper surface of the substrate body on which the semiconductor chip is placed and a lower surface of the substrate body which faces away from the upper surface.

The respective connection patterns have pad parts which extend from the inner surfaces to at least one of the upper surface and the lower surface.

The connection patterns and the pad parts are formed integrally with each other.

The respective connection patterns are placed on the upper surface of the substrate body on which the semiconductor chip is placed.

The respective connection patterns are placed on the lower surface of the substrate body which faces away from the upper surface.

The respective connection patterns are placed on the upper surface of the substrate body on which the semiconductor chip is placed and the lower surface of the substrate body which faces away from the upper surface.

The connection patterns are placed on inner surfaces of the substrate body, which are formed by upper recesses that are defined on an upper surface of the substrate body on which the semiconductor chip is placed.

The connection patterns have upper pad parts which extend from the inner surfaces to the upper surface of the substrate body.

The connection patterns and the upper pad parts are formed integrally with each other.

The connection patterns are placed on inner surfaces of the substrate body, which are formed by lower recesses that are defined on a lower surface of the substrate body, facing away from the upper surface on which the semiconductor chip is placed.

The connection patterns have lower pad parts which extend from the inner surfaces to the lower surface of the substrate body.

The connection patterns and the lower pad parts are formed integrally with each other.

The connection patterns comprise first connection patterns placed on inner surfaces of the substrate body, which are formed by upper recesses that are defined on an upper surface of the substrate body on which the semiconductor chip is placed, and second connection patterns electrically connected with the first connection patterns and placed on inner surfaces of the substrate body, which are formed by lower recesses that are defined on a lower surface of the substrate body on which the semiconductor chip is placed.

The first connection patterns have upper pad parts which extend from the inner surfaces to the upper surface, and the second connection patterns have lower pad parts which extend from the inner surfaces to the lower surface.

The first connection patterns and the upper pad parts are formed integrally with each other, and the second connection patterns and the lower pad parts are formed integrally with each other.

The semiconductor package further comprises ball land patterns placed on the lower surface of the substrate body, facing away from the upper surface on which the semiconductor chip is placed, and electrically connected with the connection patterns.

The ball land patterns comprise solder patterns which have the shape of a plate.

The semiconductor package further comprises bonding pads facing the wiring lines, and bumps electrically connecting the wiring lines and the bonding pads with each other.

The semiconductor chip of the semiconductor package has bonding pads, and the wiring lines and the bonding pads are electrically connected with each other by conductive wires.

In another aspect of the present invention, a stacked semiconductor package comprises a first semiconductor package including a first semiconductor chip which is placed on an upper surface of a first substrate and has first bonding pads, a first molding member which covers the first semiconductor chip, first wiring lines which are placed on the first substrate, are electrically connected with the first bonding pads and extend out of the first molding member, and first connection patterns which are electrically connected with exposed ends of the first wiring lines, pass through the first substrate and have first holes; a second semiconductor package including a second semiconductor chip which is placed on an upper surface of a second substrate placed over the first semiconductor package and has second bonding pads, a second molding member which covers the second semiconductor chip, second wiring lines which are placed on the second substrate, are electrically connected with the second bonding pads and extend out of the second molding member, and second connection patterns which are electrically connected with exposed ends of the second wiring lines, pass through the second substrate and have second holes aligned with the first holes; and connectors including connector bodies which are interposed between the first and second semiconductor packages and have through-holes defined at positions corresponding to the first and second holes of the first and second connection patterns, and conductive members which are inserted into the through-holes and electrically connect the first and second connection patterns with each other.

Each conductive member has the shape of a pin, and a first end of the conductive member projects out of the first hole and a second end of the conductive member, which faces away from the first end, is placed in the second hole.

The stacked semiconductor package further comprises insulation members covering the first and second ends, respectively.

The stacked semiconductor package further comprises first pad parts extending from the first connection patterns to the upper surface of the first substrate and the lower surface of the first substrate, facing away from the upper surface; second pad parts extending from the second connection patterns to the upper surface of the second substrate and the lower surface of the second substrate, facing away from the upper surface; and connection members interposed between the first pad parts and the conductive members and between the second pad parts and the conductive members.

The stacked semiconductor package further comprises ball land patterns placed on the lower surface of the first substrate, facing away from the upper surface, and electrically connected with the first wiring lines.

Each conductive member has the shape of a pin, and a first end of the conductive member and a second end of the conductive member, facing away from the first end, project out of the first hole and the second hole, respectively.

The stacked semiconductor package further comprises insulation members covering the first and second ends, respectively.

In another aspect of the present invention, a stacked semiconductor package comprises a first semiconductor package including a first semiconductor chip which is placed on an upper surface of a first substrate and has first bonding pads, a first molding member which covers the first semiconductor chip, first wiring lines which are placed on the first substrate, are electrically connected with the first bonding pads and extend out of the first molding member, and first connection patterns which are electrically connected with exposed ends of the first wiring lines and are placed on the upper surface of the first substrate; a second semiconductor package including a second semiconductor chip which is placed on an upper surface of a second substrate placed over the first semiconductor package and has second bonding pads, a second molding member which covers the second semiconductor chip, second wiring lines which are placed on the second substrate, are electrically connected with the second bonding pads and extend out of the second molding member, and second connection patterns which are electrically connected with exposed ends of the second wiring lines, pass through the second substrate and have holes aligned with the first connection patterns; and connectors including connector bodies which are interposed between the first and second semiconductor packages and have through-holes defined at positions corresponding to the first and second connection patterns, and conductive members which are inserted into the through-holes and electrically connect the first and second connection patterns with each other.

Each conductive member has the shape of a pin, and a first end of the conductive member is placed in the hole.

Each conductive member has the shape of a pin, and a first end of the conductive member projects from the second substrate out of the hole.

The stacked semiconductor package further comprises insulation members covering first ends of the conductive members.

In another aspect of the present invention, a stacked semiconductor package comprises a first semiconductor package including a first semiconductor chip which is placed on an upper surface of a first substrate and has first bonding pads, a first molding member which covers the first semiconductor chip, first wiring lines which are placed on the first substrate, are electrically connected with the first bonding pads and extend out of the first molding member, and first connection patterns which are electrically connected with exposed ends of the first wiring lines and have holes passing through the first substrate; a second semiconductor package including a second semiconductor chip which is placed on an upper surface of a second substrate and has second bonding pads, a second molding member which covers the second semiconductor chip, second wiring lines which are placed on the second substrate, are electrically connected with the second bonding pads and extend out of the second molding member, and second connection patterns which are electrically connected with exposed ends of the second wiring lines and face the first connection patterns; and connectors including connector bodies which are interposed between the first and second semiconductor packages and have through-holes defined at positions corresponding to the first and second connection patterns, and conductive members which are inserted into the through-holes and electrically connect the first and second connection patterns with each other.

Each conductive member has the shape of a pin, and a first end of the conductive member is placed in the hole.

Each conductive member has the shape of a pin, and a first end of the conductive member projects from the first substrate out of the hole.

The stacked semiconductor package further comprises insulation members covering first ends of the conductive members.

In another aspect of the present invention, a stacked semiconductor package comprises a first semiconductor package including a first semiconductor chip which is placed on an upper surface of a first substrate and has first bonding pads, a first molding member which covers the first semiconductor chip, first wiring lines which are placed on the first substrate, are electrically connected with the first bonding pads and extend out of the first molding member, and first connection patterns which are electrically connected with exposed ends of the first wiring lines and are placed on the upper surface of the first substrate; a second semiconductor package including a second semiconductor chip which is placed on an upper surface of a second substrate placed over the first semiconductor package and has second bonding pads, a second molding member which covers the second semiconductor chip, second wiring lines which are placed on the second substrate, are electrically connected with the second bonding pads and extend out of the second molding member, and second connection patterns which are electrically connected with exposed ends of the second wiring lines, are placed on a lower surface of the second substrate, facing away from the upper surface, and face the first connection patterns; and connectors including connector bodies which are interposed between the first and second semiconductor packages and have through-holes defined at positions corresponding to the first and second connection patterns, and conductive members which are inserted into the through-holes and electrically connect the first and second connection patterns with each other.

The first connection patterns and the conductive members are connected by solders, and the second connection patterns and the conductive members are connected by solders.

In still another aspect of the present invention, a stacked semiconductor package comprises a first semiconductor package including a first semiconductor chip which is placed on a first substrate and has first bonding pads, a first molding member which covers the first semiconductor chip, first wiring lines which are placed on the first substrate, are electrically connected with the first bonding pads and extend out of the first molding member, and first connection patterns which are electrically connected with the first wiring lines and are placed in first recesses defined on an upper surface of the first substrate; a second semiconductor package including a second semiconductor chip which is placed on an upper surface of a second substrate placed over the first substrate and has second bonding pads, a second molding member which covers the second semiconductor chip, second wiring lines which are placed on the second substrate, are electrically connected with the second bonding pads and extend out of the second molding member, and second connection patterns which are electrically connected with the second wiring lines, are placed in second recesses defined on a lower surface of the second substrate, facing away from the upper surface, and face the first connection patterns; and connectors including connector bodies which are interposed between the first and second semiconductor packages and have through-holes defined at positions corresponding to the first and second connection patterns, and conductive members which are inserted into the through-holes and electrically connect the first and second connection patterns with each other, placed in the first and second recesses.

The first connection patterns have first pad parts which extend from the first recesses to the upper surface of the first substrate, and the second connection patterns have second pad parts which extend from the second recesses to the lower surface of the second substrate.

In a still further aspect of the present invention, a stacked semiconductor package comprises a first semiconductor package including a first semiconductor chip which is placed on a first substrate and has first bonding pads, first wiring lines which are as placed on the first substrate and are electrically connected with the first bonding pads, and first connection patterns which are electrically connected with the first wiring lines and are placed on the first substrate; a second semiconductor package including a second semiconductor chip which is placed on an upper surface of a second substrate placed over the first substrate and has second bonding pads, a molding member which covers the second semiconductor chip, second wiring lines which are placed on the second substrate, are electrically connected with the second bonding pads and extend out of the molding member, and second connection patterns which are electrically connected with the second wiring lines, are formed on a lower surface of the second substrate, facing away from the upper surface, and face the first connection patterns; and connectors including connector bodies which are interposed between the first and second semiconductor packages and have through-holes defined at positions corresponding to the first and second connection patterns, and conductive members which are inserted into the through-holes and electrically connect the first and second connection patterns with each other.

The stacked semiconductor package further comprise a gap-fill member which is filled between the first and second semiconductor packages.

The stacked semiconductor package further comprises ball land patterns placed on a lower surface of the first substrate, facing away from an upper surface of the first substrate, and electrically connected with the conductive members.

The ball land patterns comprise solders.

The first and second connection patterns, which face each other, are placed in a zigzag pattern when viewed from the top.

DESCRIPTION OF SPECIFIC EMBODIMENTS

Hereafter, semiconductor packages and stacked semiconductor packages having the same will be described in detail with reference to the accompanying drawings. In this regard, it is to be noted that the present invention is not limited to the following embodiments, and those having ordinary knowledge in the art will appreciate that the present invention can be realized in a variety of different ways without departing from the technical spirit of the present invention.

A semiconductor package according to embodiments of the present invention includes a substrate, a semiconductor chip, and a molding member. The substrate includes a substrate body, wiring lines, and connection patterns. The substrate body has a first region, a second region defined around the first region, and a third region defined around the second region. The wiring lines are disposed on the substrate body and have first ends which extend to the third region. The connection patterns are disposed in the third region and are electrically connected to the first ends of the wiring lines. For example, the connection patterns can have the shape of a hollow pipe that passes through substrate from the upper surface to the lower surface facing away from the upper surface of the substrate. As one alternative, the connection patterns can be placed on the upper surface or the lower surface of the substrate. As another alternative, the connection patterns can be placed on inner surfaces of the substrate, that is, on surfaces of recesses defined in the upper surface or the lower surface of the substrate.

The semiconductor chip is disposed in the first region and is electrically connected to the wiring lines.

The molding member covers the first and second regions, and thereby the semiconductor chip is covered by the molding member.

Hereinafter, various embodiments of the semiconductor package according to the present invention will be described with reference to the attached drawings.

Figure 1:
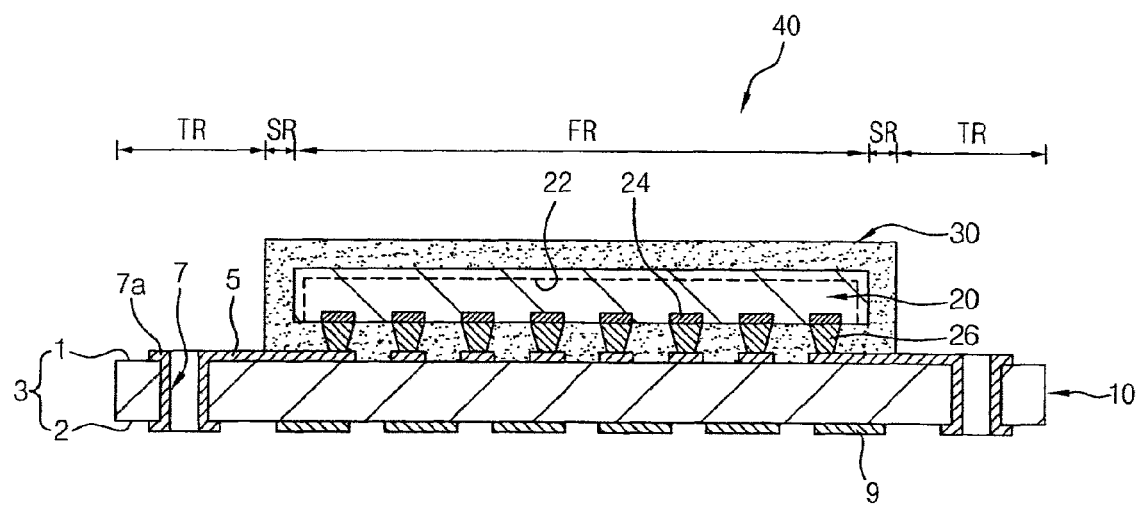
FIG. 1 is a cross-sectional view showing a semiconductor package in accordance with an embodiment of the present invention.

FIG. 1 is a cross-sectional view showing a semiconductor package in accordance with an embodiment of the present invention.

Referring to FIG. 1, a semiconductor package 40 includes a substrate 10, a semiconductor chip 20, and a molding member 30.

The substrate 10 includes a substrate body 3, wiring lines 5, and connection patterns 7.

The substrate body 3 can have the shape of a quadrangular plate when viewed from the top. For example, the substrate body 3 having the shape of a quadrangular plate (when viewed from the top) has an upper surface 1 and a lower surface 2 facing away from the upper surface 1.

The substrate body 3 is divided, for example, into three regions. Hereinbelow, the respective regions will be defined as a first region FR, a second region SR, and a third region TR.

The first region FR is defined at the center portion of the substrate body 3. In the present embodiment, the first region FR can have a transverse sectional shape and a surface area corresponding to those of the semiconductor chip 20 (that is, the shape of the first region corresponds to the shape of the semiconductor chip 20 in the long axis direction and the first region has a surface area corresponding to that of the semiconductor chip 20).

The second region SR is defined around the first region FR. In the present embodiment, the second region SR can have a transverse sectional shape and a surface area corresponding to those of the molding member 30 covering the semiconductor chip 20 as shown in FIG. 1 and as will be described later.

The third region TR is defined around the second region SR. In the present embodiment, the connection patterns 7 are disposed in the third region TR.

The wiring lines 5 are disposed in parallel on, for example, the upper surface 1 of the substrate body 3. In the present embodiment, the respective wiring lines 5 have the shape of a line when viewed from the top. The first ends of the wiring lines 1 (which have the shape of a line when viewed from the top) are disposed in the first region FR, and the second ends of the respective wiring lines 5, which face away from the first ends, are disposed in the third region TR.

Additional wiring lines (not shown) can be disposed on the lower surface 2 of the substrate body 3. The first ends of the additional wiring lines can be disposed in the third region TR, and the second ends of the additional wiring lines, which face away from the first ends, can be disposed in the second region SR or the first region FR.

The connection patterns 7 are disposed in the third region TR. In the embodiment shown in FIG. 1, the connection patterns 7 are disposed in through-holes that are defined within the substrate body 3 and which pass from the upper surface 1 to the lower surface 2 of the substrate body 3. In the present embodiment, the connection patterns 7 are disposed on the inner surfaces of the substrate body 3 formed as a result of the through-holes (i.e. formed on the surface of the through-holes. In the present embodiment, the connection patterns 7 have the shape of, for example, a hollow pipe. The connection patterns 7 are electrically connected to the wiring lines 5 formed on the upper surface 1 and/or the lower surface 2 of the substrate body 3.

In the present embodiment, the connection patterns 7 may contain a material having excellent conductive characteristics such as copper. For example, the connection patterns 7 and the wiring lines 5 are formed integrally with each other.

In addition, the respective connection patterns 7 can include pad parts 7a. The pad parts 7a extend from first ends of the connection patterns 7 along the upper surface 1 of the substrate body 3, and from second ends of the connection patterns 7, the second ends facing away from the first ends, along the lower surface 2 of the substrate body 3. In the present embodiment, the pad parts 7a, which extend from the respective connection patterns 7 along the upper surface 1 and the lower surface 2 of the substrate body 3, have the shape of a donut when viewed from the top. In the present embodiment, the pad parts 7a and the connection patterns 7 can be formed integrally with each other.

The semiconductor chip 20 having the shape of a rectangular hexahedron may, for example, be placed in the first region FR. In the present embodiment, the semiconductor chip 20 includes a circuit section 22 and bonding pads 24.

In the present embodiment, the circuit section 22 has a data storage unit (not shown) for storing data and a data processing unit (not shown) for processing data. The bonding pads 24 are electrically connected to the circuit section 22.

In the present embodiment, the respective bonding pads 24 of the semiconductor chip 20 face the upper surface 1 of the substrate body 3. The bonding pads 24 are electrically connected to the wiring lines 5, which are placed on the upper surface 1 of the substrate body 3, respectively.

In the present embodiment, the semiconductor chip 20 also includes bumps 26, which are electrically connected to the bonding pads 24, respectively. The respective bonding pads 24 and the respective wiring lines 5 are electrically connected to each other by the respective bumps 26. In an alternative embodiment, the bonding pads 24 of the semiconductor chip 20 can face the upper surface 1 of the substrate body 3, and the respective bonding pads 24 and the respective wiring lines 5 can be bonded by conductive wires.

Connection patterns 9 are disposed on the lower surface 2 of the substrate body 3. In the present embodiment, the respective connection patterns 9 can have the shape of a thin film and can comprise solders having a low melting point.

The molding member 30 covers the first and second regions FR and SR. As such, the molding member 30 covers the semiconductor chip 20, which is disposed in the first region FR. Although the molding member 30 is described as covering the first and second regions FR and SR in the present embodiment, as an alternative, the molding member 30 can cover the first through third regions FR, SR and TR and can have through-holes that are formed in the third region to expose the connection patterns 7.

Figure 2:
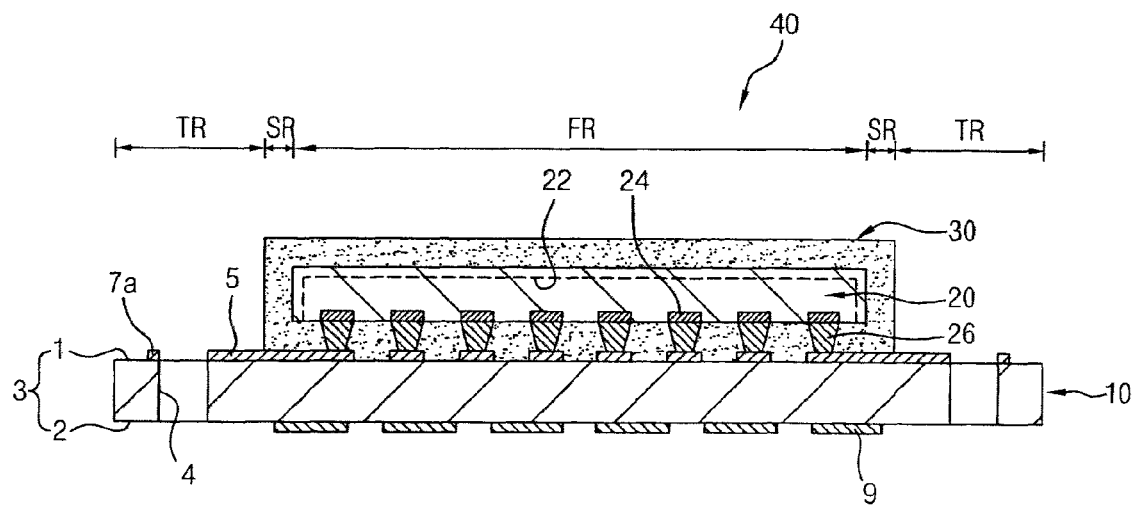
FIG. 2 is a cross-sectional view showing a semiconductor package in accordance with another embodiment of the present invention.

FIG. 2 is a cross-sectional view showing a semiconductor package in accordance with another embodiment of the present invention. The semiconductor package shown in FIG. 2 is substantially the same as the semiconductor package shown in FIG. 1 except for the connection patterns. Therefore, a repeated description of the same component parts will be omitted herein, and the same reference numerals and the same terms will be used to refer to the same component parts.

Referring to FIG. 2, end portions of the respective wiring lines 5, which extend to the third region TR from the molding member 30, have an opening; and a through hole 4 that passes through the substrate body 3 from the upper surface 1 to the lower surface is formed at a portion corresponding to the opening.

Figure 3:
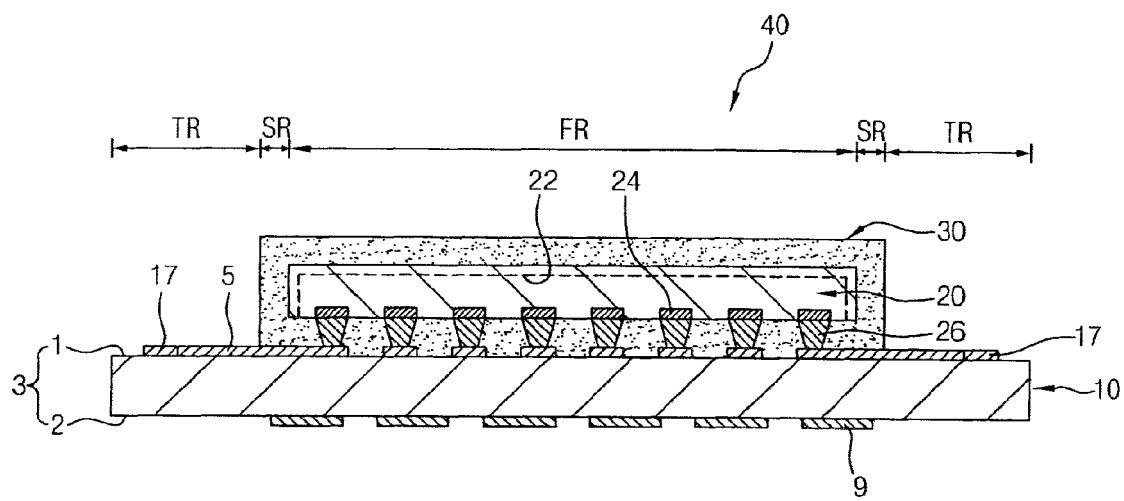
FIG. 3 is a cross-sectional view showing a semiconductor package in accordance with another embodiment of the present invention.

FIG. 3 is a cross-sectional view showing a semiconductor package in accordance with another embodiment of the present invention. The semiconductor package shown in FIG. 3 is substantially the same as the semiconductor package according to the embodiment shown in FIG. 1 except for the connection patterns. Therefore, a repeated description of the same component parts will be omitted herein, and the same reference numerals and the same terms will be used to refer to the same component parts.

Referring to FIG. 3, a semiconductor package 40 includes a substrate 10, a semiconductor chip 20, and a molding member 30.

The substrate 10 includes a substrate body 3, wiring lines 5, and connection patterns 17.

In the present embodiment, the connection patterns 17 are disposed on the upper surface 1 of the substrate body 3 in the third region TR. In an embodiment of the present invention, the connection patterns 17 are formed integrally with the wiring lines 5 and have the shape of a pad that is wider than the wiring lines 5.

In the present embodiment, the molding member 30 may cover the first and second regions FR and SR. Alternatively, the molding member 30 can cover the first through third regions FR, SR and TR and can have openings formed therein which expose the connection patterns 17 disposed in the third region TR.

Figure 4:
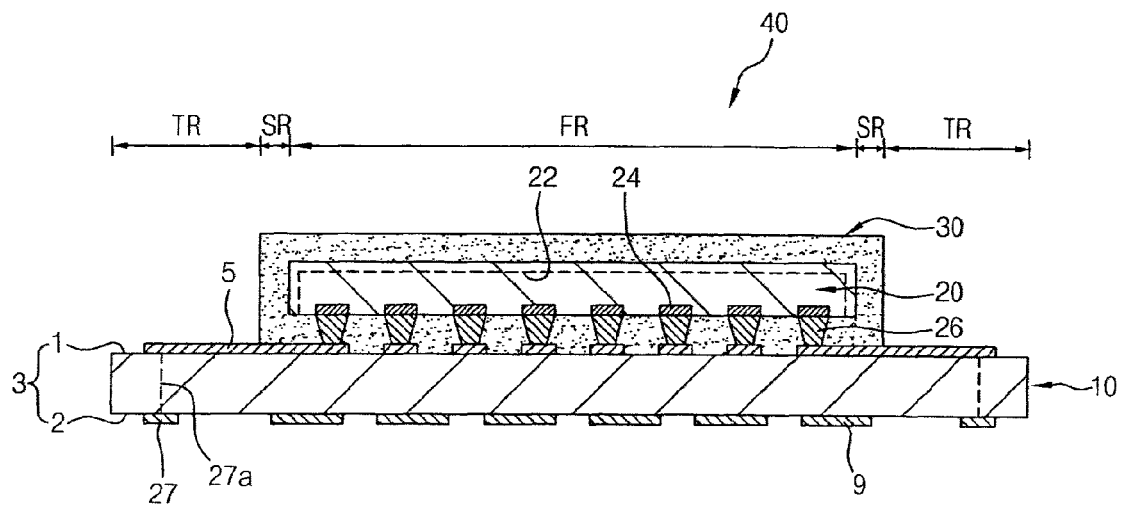
FIG. 4 is a cross-sectional view showing a semiconductor package in accordance with another embodiment of the present invention.

FIG. 4 is a cross-sectional view showing a semiconductor package in accordance with another embodiment of the present invention. The semiconductor package shown in FIG. 4 is substantially the same as the semiconductor package according to the embodiment shown in FIG. 1 except for the connection patterns and the connection vias. Therefore, a repeated description of the same component parts will be omitted herein, and the same reference numerals and the same terms will be used to refer to the same component parts.

Referring to FIG. 4, a semiconductor package 40 includes a substrate 10, a semiconductor chip 20, and a molding member 30.

The substrate 10 includes a substrate body 3, wiring lines 5, and connection patterns 27.

In the present embodiment, the connection patterns 27 are disposed on the lower surface 2 of the substrate body 3 in the third region TR. In an embodiment of the present invention, the connection patterns 27 are disposed at a position such that they face away from portions of the wiring lines 5 as is shown in FIG. 4. The connection patterns 27, which are disposed on the lower surface 2 of the substrate body 3, are electrically connected to the wiring lines 5, which are disposed on the upper surface 1 of the substrate body 3, through connection vias 27a. The connection patterns 27, which are placed on the lower surface 2 of the substrate body 3, have the shape of a pad that is wider than the wiring lines 5.

In the present embodiment, the molding member 30 can cover the first and second regions FR and SR. Alternatively, the molding member 30 can cover the first through third regions FR, SR and TR and can have openings formed therein which expose the portions of the wiring lines 5 in the third region TR.

Figure 5:
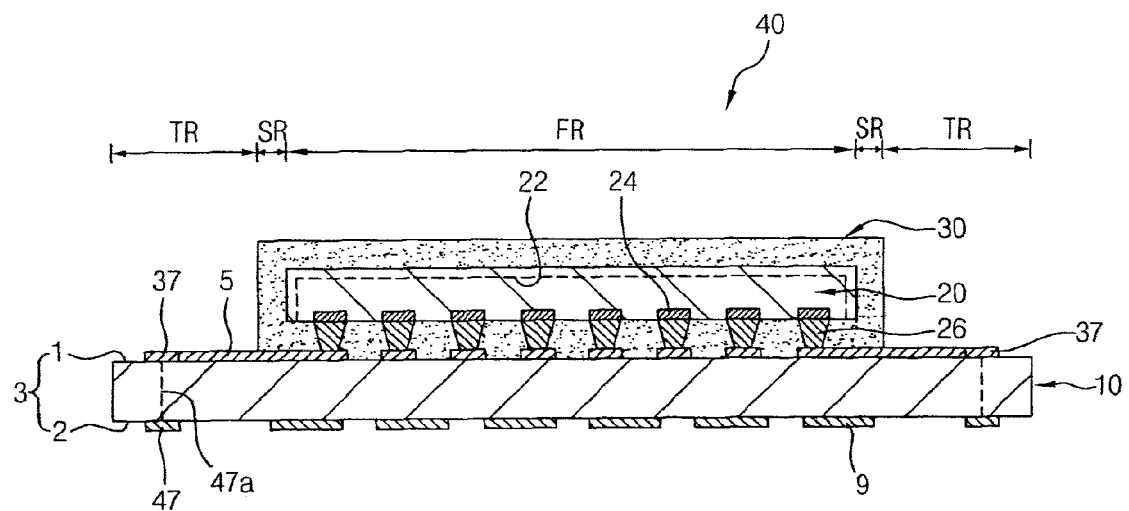
FIG. 5 is a cross-sectional view showing a semiconductor package in accordance with another embodiment of the present invention.

FIG. 5 is a cross-sectional view showing a semiconductor package in accordance with another embodiment of the present invention. The semiconductor package shown in FIG. 5 is substantially the same as the semiconductor package according to the embodiment shown in FIG. 1 except for the first connection patterns, second connection patterns and connection vias. Therefore, a repeated description of the same component parts will be omitted herein, and the same reference numerals and the same terms will be used to refer to the same component parts.

Referring to FIG. 5, a semiconductor package 40 includes a substrate 10, a semiconductor chip 20, and a molding member 30.

The substrate 10 includes a substrate body 3, wiring lines 5, first connection patterns 37, second connection patterns 47, and connection vias 47a.

In the present embodiment, the first connection patterns 37 are disposed on the upper surface 1 of the substrate body 3 and are electrically connected to the ends of the wiring lines 5 that extend to the third region TR on the upper surface 1 of the substrate body 3. The first connection patterns 37 may be, for example, integrally formed with the corresponding wiring lines 5 and can have the shape of a pad that is wider than the wiring lines 5.

The second connection patterns 47 are disposed on the lower surface 2 of the substrate body 3 and face away from the first connection patterns 37, which are disposed on the upper surface 1 of the substrate body 3. In the present embodiment, the second connection patterns 47 have the shape of a pad when viewed from the top.

The connection vias 47a extend through the substrate body 3 and electrically connect the first connection patterns 37 to the second connection patterns 47. In the present embodiment, the connection vias 47a can comprise through-electrodes passing through the substrate body 3.

In the present embodiment, the molding member 30 can cover the first and second regions FR and SR on the upper surface 1 of the substrate body 3. Alternatively, the molding member 30 can cover the first through third regions FR, SR and TR on the upper surface 1 of the substrate body 3 and can have openings formed therein which expose the first connection patterns 37 in the third region TR.

Figure 6:
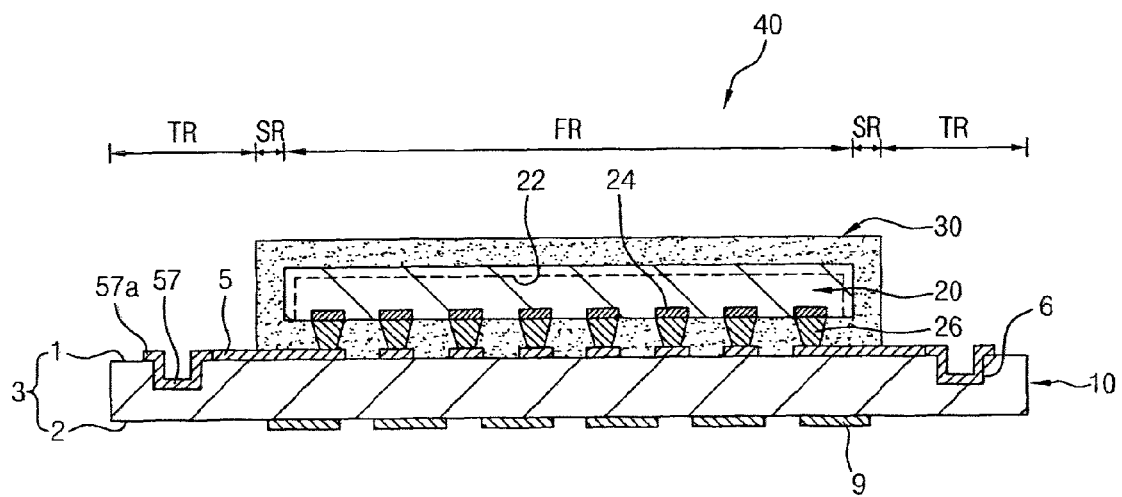
FIG. 6 is a cross-sectional view showing a semiconductor package in accordance with another embodiment of the present invention.

FIG. 6 is a cross-sectional view showing a semiconductor package in accordance with another embodiment of the present invention. The semiconductor package shown in FIG. 6 is substantially the same as the semiconductor package according to the embodiment shown in FIG. 1 except for the connection patterns and recesses. Therefore, a repeated description of the same component parts will be omitted herein, and the same reference numerals and the same terms will be used to refer to the same component parts.

Referring to FIG. 6, a semiconductor package 40 includes a substrate 10, a semiconductor chip 20, and a molding member 30.

The substrate 10 includes a substrate body 3, wiring lines 5, and connection patterns 57.

Recesses 6 are defined within the upper surface 1 of the substrate body 3, such that the recesses 6 have a predetermined depth when measured from the upper surface 1 of the substrate body 3. The number of recesses 6 defined within the upper surface 1 corresponds to (or is equal to) the number of the wiring lines 5.

The connection patterns 57 are formed on the inner surfaces of the substrate body 3 within the recesses 6 (that is, the connection patterns 57 are formed on the surfaces of the recesses 6, respectively). The connection patterns 57, which are formed within the recesses 6, can have a sectional shape of a cup, as is shown, for example, in FIG. 6.

The connection patterns 57 can include pad parts 57a. The pad parts 57a are formed integrally with the connection patterns 57 and extend to and along the upper surface 1 of the substrate body 3. In the present embodiment, the pad parts 57a can have the shape of a donut when viewed from the top. Alternatively, each pad part 57a can be formed such that a plural number of portions can be formed on the upper end of each connection pattern 57 to extend radially when viewed from the top. By forming the plural number of portions on the upper end of each connection pattern 57 to extend radially, the surface area of the respective pad parts 57a can be increased.

In the present embodiment, the molding member 30 can cover the first and second regions FR and SR. Alternatively, the molding member 30 can cover the first through third regions FR, SR and TR and can have openings formed therein which expose the connection patterns 57 in the third region TR.

Figure 7:
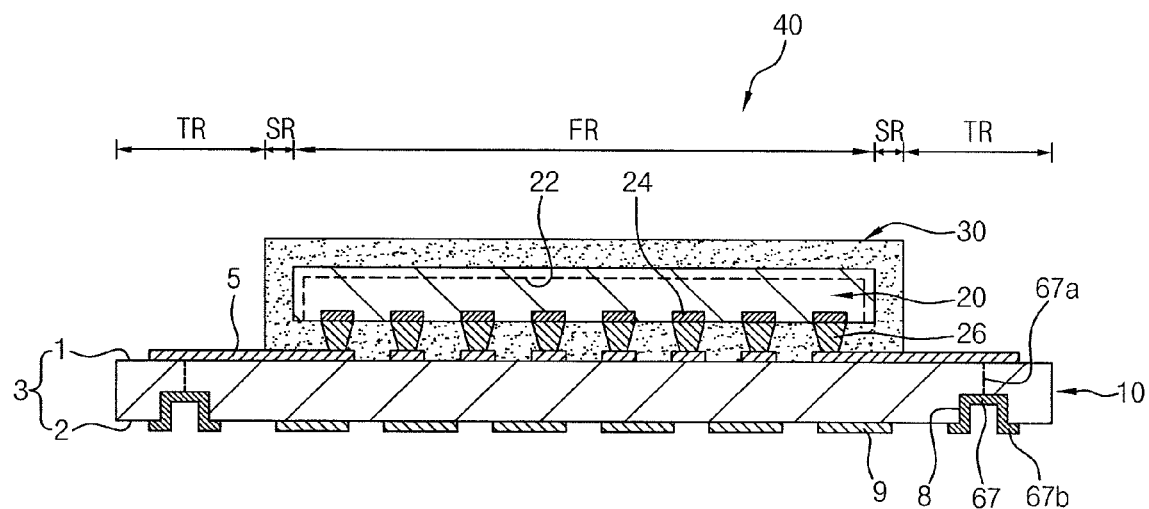
FIG. 7 is a cross-sectional view showing a semiconductor package in accordance with another embodiment of the present invention.

FIG. 7 is a cross-sectional view showing a semiconductor package in accordance with another embodiment of the present invention. The semiconductor package shown in FIG. 7 is substantially the same as the semiconductor package according to the first embodiment except for the connection patterns, recesses and connection vias. Therefore, a repeated description of the same component parts will be omitted herein, and the same reference numerals and the same terms will be used to refer to the same component parts.

Referring to FIG. 7, a semiconductor package 40 includes a substrate 10, a semiconductor chip 20, and a molding member 30.

The substrate 10 includes a substrate body 3, wiring lines 5, connection patterns 67, and connection vias 67a.

Recesses 8 are defined within the lower surface 2 of the substrate body 3 such that the recesses 8 have a predetermined depth when measured from the lower surface 2 of the substrate body 3. The number of the recesses 8 defined within the lower surface 2 corresponds to (or is equal to) the number of the wiring lines 5.

The connection patterns 67 are formed on the inner surfaces of the substrate body 3 within the recesses 8 (that is, the connection patterns 67 are formed on the surfaces of the recesses 8, respectively). The connection patterns 67, which are formed within the recesses 8, can have a sectional shape of a cup. In the present embodiment, for example, the connection patterns 67 face away from portions of the wiring lines 5.

The connection patterns 67 can include pad parts 67b. The pad parts 67b are formed integrally with the connection patterns 67 and extend to and along the lower surface 2 of the substrate body 3. In the present embodiment, the pad parts 67b can have the shape of a donut when viewed from the bottom. Alternatively, each pad part 67b can be formed such that a plural number of portions can be formed on the lower end of each connection pattern 67 to extend radially when viewed from the bottom. By forming the plural number of portions on the lower end of each connection pattern 67 to extend radially, the surface area of the respective pad parts 67b can be increased.

The connection vias 67a pass through the substrate body 3 and electrically connect the portions of the wiring lines 5 to the connection patterns 67, which correspond respectively to the portions of the wiring lines 5.

In the present embodiment, the molding member 30 can cover the first and second regions FR and SR. Alternatively, the molding member 30 can cover the first through third regions FR, SR and TR and can have openings formed therein which expose the portions of the wiring lines 5 in the third region TR.

Figure 8:
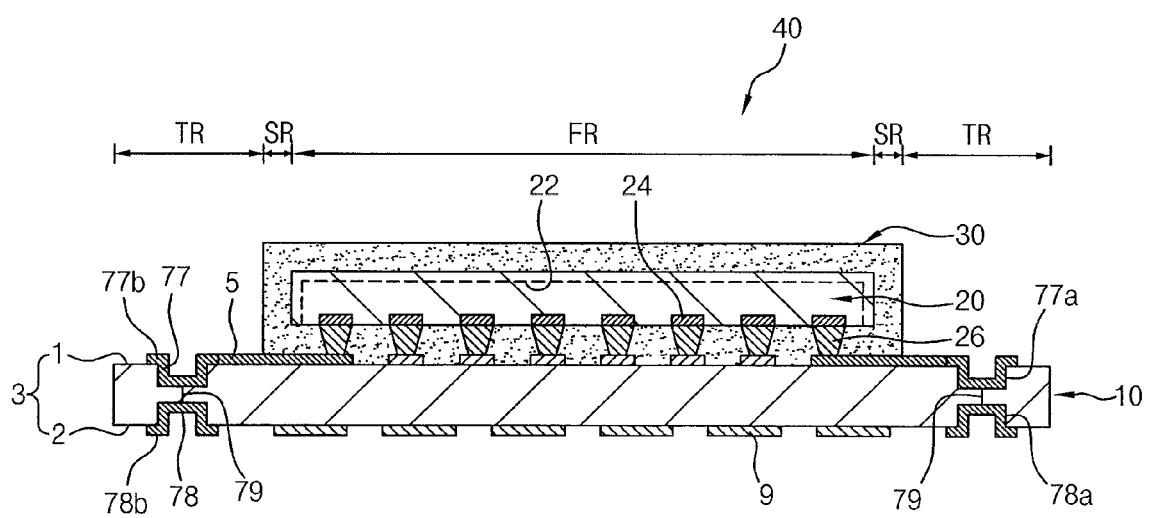
FIG. 8 is a cross-sectional view showing a semiconductor package in accordance with another embodiment of the present invention.

FIG. 8 is a cross-sectional view showing a semiconductor package in accordance with another embodiment of the present invention. The semiconductor package shown in FIG. 8 is substantially the same as the semiconductor package according to the first embodiment except for the first and second connection patterns, first and second recesses, and connection vias. Therefore, a repeated description of the same component parts will be omitted herein, and the same reference numerals and the same terms will be used to refer to the same component parts.

Referring to FIG. 8, a semiconductor package 40 includes a substrate 10, a semiconductor chip 20, and a molding member 30.

The substrate 10 includes a substrate body 3, wiring lines 5, first connection patterns 77, second connection patterns 78, and connection vias 79.

First recesses 77a are defined within the upper surface 1 of the substrate body 3 such that the first recesses 77a have a predetermined depth when measured from the upper surface 1 of the substrate body 3. The number of the first recesses 77a defined within the upper surface 1 corresponds to (or is equal to) of the number of the wiring lines 5.

The first connection patterns 77 are formed on the inner surfaces of the substrate body 3 within the first recesses 77a (that is, the first connection patterns 77 are formed on the surfaces of the recesses 77a). The first connection patterns 77, which are formed within the first recesses 77a, can have the sectional shape of a cup. In the present embodiment, the first connection patterns 77 are electrically connected to, for example, the respective wiring lines 5.

The first connection patterns 77 can include first pad parts 77b. The first pad parts 77b are formed integrally with the first connection patterns 77 and extend to and along the upper surface 1 of the substrate body 3. In the present embodiment, the first pad parts 77b can have the shape of a donut when viewed from the top. Alternatively, each first pad part 77b can be formed such that a plural number of portions can be formed on the upper end of each first connection pattern 77 to extend radially when viewed from the top. By forming the plural number of portions on the upper end of each first connection pattern 77 to extend radially, the surface area of the respective first pad parts 77b can be increased.

Second recesses 78a are defined within the lower surface 2 of the substrate body 3 such that the second recesses 78a have a predetermined depth when measured from the lower surface 2 of the substrate body 3. The second recesses 78a are defined at positions substantially corresponding to (or directly aligned with as shown in FIG. 8) the first recesses 77a, and the number of the second recesses 78a within the lower surface 2 corresponds to (or is equal to) the number of the wiring lines 5.

The second connection patterns 78 are formed on the inner surfaces of the substrate body 3 within the second recesses 78a (that is, the second connection patterns 78 are formed on the surfaces of the second recesses 78a). The second connection patterns 78, which are formed within the second recesses 78a, can have the sectional shape of a cup. In the present embodiment, the second connection patterns 78 are electrically connected to, for example, the first connection patterns 77 by the connection vias 79.

The second connection patterns 78 can include second pad parts 78b. The second pad parts 78b are formed integrally with the second connection patterns 78 and extend to and along the lower surface 2 of the substrate body 3. In the present embodiment, the second pad parts 78b can have the shape of a donut when viewed from the bottom. Alternatively, each second pad part 78b can be formed such that a plural number of portions can be formed on the lower end of each second connection pattern 78 to extend radially when viewed from the bottom. By forming the plural number of portions on the lower end of each second connection pattern 78 to extend radially, the surface area of the respective second pad parts 78b can be increased.

The connection vias 79 pass through the substrate body 3 and electrically connect the first and second connection patterns 77 and 78.

In the present embodiment, the molding member 30 can cover the first and second regions FR and SR. Alternatively, the molding member 30 can cover the first through third regions FR, SR and TR and can have openings formed therein which expose the first connection patterns 77 in the third region TR.

Figure 9:
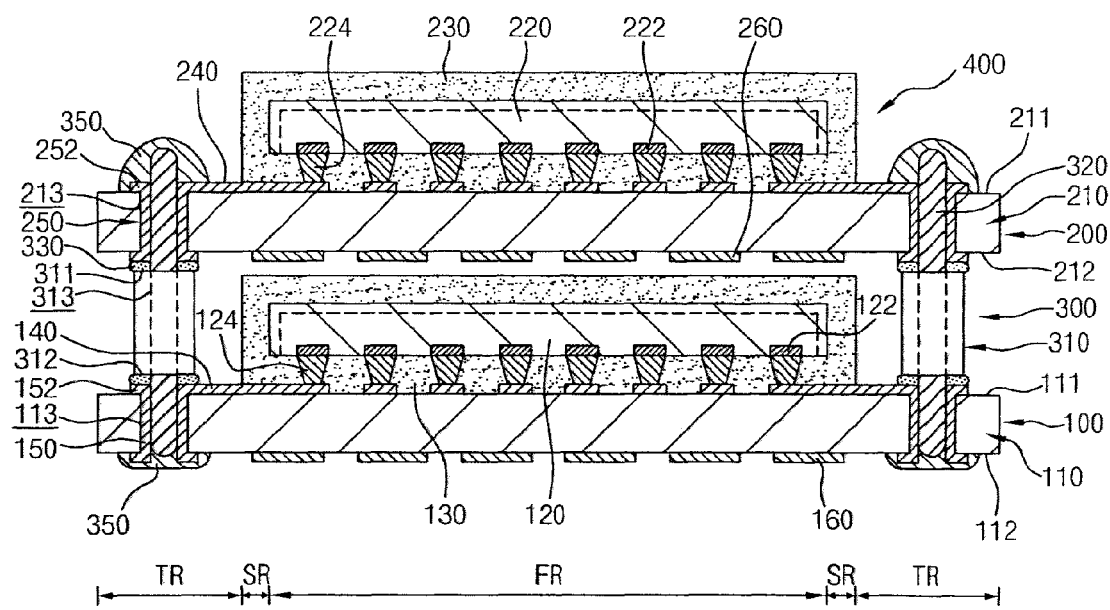
FIG. 9 is a cross-sectional view showing a stacked semiconductor package in accordance with another embodiment of the present invention.

FIG. 9 is a cross-sectional view showing a stacked semiconductor package in accordance with another embodiment of the present invention.

Referring to FIG. 9, a stacked semiconductor package 400 includes a first semiconductor package 100, a second semiconductor package 200, and connectors 300.

The first semiconductor package 100 includes a first substrate 110, a first semiconductor chip 120, a first molding member 130, first wiring lines 140, and first connection patterns 150.

The first substrate 110 has the shape of, for example, a rectangular hexahedral plate. The first substrate 110 (which has, for example, the a rectangular hexahedral plate shape) has an upper surface 111 and a lower surface 112 facing away from the upper surface 111.

The first substrate 110 is divided into a first region FR, a second region SR, and a third region TR.

When viewing the first substrate 110 from the top, the first region FR is defined at the center portion of the first substrate 110. For example, the first region FR has a transverse sectional shape and a surface area corresponding to (or the same as) those of the first semiconductor chip 120, which is described later in more detail.

The second region SR is defined around the first region FR in the shape of a rectangular band. The first molding member 130 (which will be described later in more detail) is disposed in the first and second regions FR and SR to cover the first semiconductor chip 120.

The third region TR is defined around the second region SR.

A plurality of the first wiring lines 140 are disposed on the upper surface 111 of the first substrate 110. The first wiring lines 140 (having the plural number) extend, for example, from the first region FR to the third region TR of the first substrate 110.

The first connection patterns 150 are disposed in the third region TR of the first substrate 110. In the present embodiment, the first connection patterns 150 are disposed in through-holes 113, which are defined to pass through the first substrate 100 extending from the upper surface 111 to the lower surface 112. Each of the first connection patterns 150 is disposed in a corresponding one of the through-holes 113 and each has the shape of a pipe having a first hole. The first connection patterns 150 include first pad parts 152. The first pad parts 152 extend from the first connection patterns 150 disposed in the through-holes 113 to and along the upper surface 111 and the lower surface 112 of the first substrate 110, respectively. In the present embodiment, the first pad parts 152, which are disposed on the upper surface 111 and the lower surface 112 of the first substrate 110, can have the shape of a donut when viewed from the top and the bottom, respectively.

In the present embodiment, the first wiring lines 140, the first connection patterns 150, and the first pad parts 152 (which correspond respectively to the first wiring lines 140), may be formed, for example, integrally with one another. Examples of a material that can be used to form the first wiring lines 140 and the first connection patterns 150 include copper, copper alloy, aluminum, and aluminum alloy.

The first semiconductor chip 120 is disposed, for example, in the first region FR on the upper surface 111 of the first substrate 110. In the present embodiment, the first semiconductor chip 120 can comprise, for example, a NAND memory chip.

The first semiconductor chip 120 includes a first circuit section (not shown), a plurality of first bonding pads 122, and a plurality of first bumps 124.

The first circuit section has a data storage unit (not shown) for storing data and a data processing unit (not shown) for processing data.

The first bonding pads 122 are electrically connected to the first circuit section. The first bonding pads 122 are disposed, for example, along the edges of the first semiconductor chip 120. The first bonding pads 122 are disposed at positions corresponding respectively to the ends of the first wiring lines 140 disposed in the first region FR.

The first bumps 124 are interposed respectively between the first bonding pads 122 and the first wiring lines 140 corresponding respectively to the first bonding pads 122, by which the first bonding pads 122 and the first wiring lines 140 are connected to each other in a flip chip manner.

The first molding member 130 is disposed on the upper surface 111 of the first substrate 110. The first molding member 130 covers the first region FR and the second region SR of the first substrate 110, and thereby, the first semiconductor chip 120 disposed in the first region FR is covered by the first molding member 130. In the present embodiment, the first molding member 130 can be formed of, for example, an epoxy resin.

Ball land patterns 160 are formed on the lower surface 112 of the first substrate 110 and are electrically connected to the first connection patterns 150. Alternatively, the ball land patterns 160 can be electrically connected to the first wiring lines 140 through the first substrate 110.

Referring again to FIG. 9, the second semiconductor package 200 includes a second substrate 210, a second semiconductor chip 220, a second molding member 230, second wiring lines 240, and second connection patterns 250.

The second substrate 210 has the shape of, for example, a rectangular hexahedral plate. The second substrate 210 (which has, for example, the shape of a rectangular hexahedral plate) has an upper surface 211 and a lower surface 212 facing away from the upper surface 211. In the present embodiment, the second substrate 210 is positioned over the first substrate 110, and the upper surface 111 of the first substrate 110 faces the lower surface 212 of the second substrate 210.

The second substrate 210 is divided into a first region FR, a second region SR, and a third region TR. The first through third regions FR, SR and TR of the second substrate 210 are substantially the same as (e.g., substantially aligned with) the first through third regions FR, SR and TR of the first substrate 110.

When viewing the second substrate 210 from the top, the first region FR is defined at the center portion of the second substrate 210. For example, the first region FR has a transverse sectional shape and a surface area corresponding to (or the same as) those of the second semiconductor chip 220 which will be described later in more detail.

The second region SR is defined around the first region FR in the shape of a rectangular band. The second molding member 230 (which will be described later in more detail) is disposed in the first and second regions FR and SR to cover the second semiconductor chip 220.

The third region TR is defined around the second region SR.

A plurality of the second wiring lines 240 are disposed on the upper surface 211 of the second substrate 210. The second wiring lines 240 (having the plural number) extend, for example, from the first region FR to the third region TR of the second substrate 210.

The second connection patterns 250 are disposed in the third region TR of the second substrate 210. In the present embodiment, the second connection patterns 250 are disposed in through-holes 213, which are defined to pass through the second substrate 210 extending from the upper surface 211 to the lower surface 212. Each of the second connection patterns 250 is disposed in a corresponding one of the through-holes 213 and each has the shape of a pipe having a second hole. The second connection, patterns 250 include second pad parts 252. The second pad parts 252 extend from the second connection patterns 250 disposed in the through-holes 213 to and along the upper surface 211 and the lower surface 212 of the second substrate 210, respectively. In the present embodiment, the second pad parts 252, which are disposed on the upper surface 211 and the lower surface 212 of the second substrate 210, can have the shape of a donut when viewed from the top and the bottom, respectively.

In the present embodiment, the second connection patterns 250 of the second substrate 210 are disposed at positions that face the first connection patterns 150 of the first substrate 110.

In the present embodiment, the second wiring lines 240, the second connection patterns 250, and the second pad parts 252 (which correspond respectively to the second wiring lines 240) may be formed, for example, integrally with one another. Examples of a material that can be used to form the second wiring lines 240 and the second connection patterns 250 include copper, copper alloy, aluminum, and aluminum alloy.

The second semiconductor chip 220 is disposed, for example, in the first region FR on the upper surface 211 of the second substrate 210. In the present embodiment, the second semiconductor chip 220 can comprise, for example, a NAND memory chip. Alternatively, the second semiconductor chip 220 can comprise a system semiconductor chip.

The second semiconductor chip 220 includes a second circuit section (not shown), a plurality of second bonding pads 222, and a plurality of second bumps 224.

The second circuit section has a data storage unit (not shown) for storing data and a data processing unit (not shown) for processing data.

The second bonding pads 222 are electrically connected to the second circuit section. The second bonding pads 222 are disposed, for example, along the edges of the second semiconductor chip 220. The second bonding pads 222 are disposed at positions corresponding respectively to the ends of the second wiring lines 240 disposed in the first region FR.

The second bumps 224 are interposed respectively between the second bonding pads 222 and the second wiring lines 240 corresponding respectively to the second bonding pads 222, by which the second bonding pads 222 and the second wiring lines 240 are connected to each other in a flip chip manner.

The second molding member 230 is disposed on the upper surface 211 of the second substrate 210. The second molding member 230 covers the first region FR and the second region SR of the second substrate 210, and thereby, the second semiconductor chip 220 disposed in the first region FR is covered by the second molding member 230. In the present embodiment, the second molding member 230 can be formed of, for example, an epoxy resin.

Ball land patterns 260 are formed on the lower surface 212 of the second substrate 210 and are electrically connected to the second connection patterns 250. Alternatively, the ball land patterns 260 can be electrically connected to the second wiring lines 240 through the second substrate 210.

The connectors 300 are interposed between the first semiconductor package 100 and the second semiconductor package 200. The connectors 300 electrically connect the first and second semiconductor packages 100 and 200 to each other.

Each connector 300 includes a connector body 310 and a conductive member 320.

The connector body 310 may have the shape of, for example, a square column. The connector body 310 can be formed of an insulation material such as synthetic resin. The connector body 310 has a first surface 311 facing the lower surface 212 of the second substrate 210 and a second surface 312 facing the upper surface 111 of the first substrate 110. Alternatively, the connector body 310 has a rectangular frame shape including an opening for receiving the first molding member when viewing from a plane.

The connector body 310 also includes a through-hole 313 which passes through the connector body 310 from the first surface 311 to the second surface 312. The through-holes 313 of the connector bodies 310 are defined, for example, at positions corresponding to (or aligned with) the respective first connection patterns 150 of the first substrate 110 and the respective second connection patterns 250 of the second substrate 210 (for example, a connector body 310 can be aligned with a corresponding one of the first connection patterns 150 and a corresponding one of the second connection patterns 250).

In the present embodiment, the respective conductive members 320 have the shape of a pin. The conductive member 320 (which has the shape of a pin) is disposed in the through-hole 313 defined in the connector body 310. Both ends of the conductive member 320 project out of the connector body 310.

One end (referred to as a first end) of each conductive member 320 is inserted into the first hole of a corresponding first connection pattern 150 of the first substrate 110, and the other end (referred to as a second end) of each conductive member 320, which faces away from the end of the conductive member inserted into the first hole, is inserted into the second hole of a corresponding second connection pattern 250 of the second substrate 210. As a result, the conductive member 320 is electrically connected to the first and second connection patterns 150 and 250.

The first end of the conductive member 320, which is inserted into the first hole of the first connection pattern 150, is disposed inside the first hole, whereas the second end of the conductive member 320, which is inserted into the second hole of the second connection pattern 250, passes through the second hole and projects out of the upper surface 211 of the second substrate 210 by a predetermined distance.

Connection members 330, which have a low melting point, are interposed respectively between the connector bodies 310 and the first pad parts 152 of the first connection pattern 150 so that the respective connection members are connected to the side surface of the conductive member 320, and connection members 330 are interposed respectively between the connector bodies 300 and the second pad parts 252 of the second connection pattern 250 so that the respective connection members are connected to the side surface of the conductive member 320. The connection members 330 can comprise, for example, solders. The connection members 330 are securely connected to the side surface of the conductive member 320 (as is shown in FIG. 9) due to the presence of the first pad part 152 and the second pad part 252.

The stacked semiconductor package 400 according to the present embodiment may also include insulation members 350 which cover and insulate both ends of the respective conductive members 320. The insulation members 350 can comprise, for example, a synthetic resin such as epoxy resin or an organic material.

Figure 10:
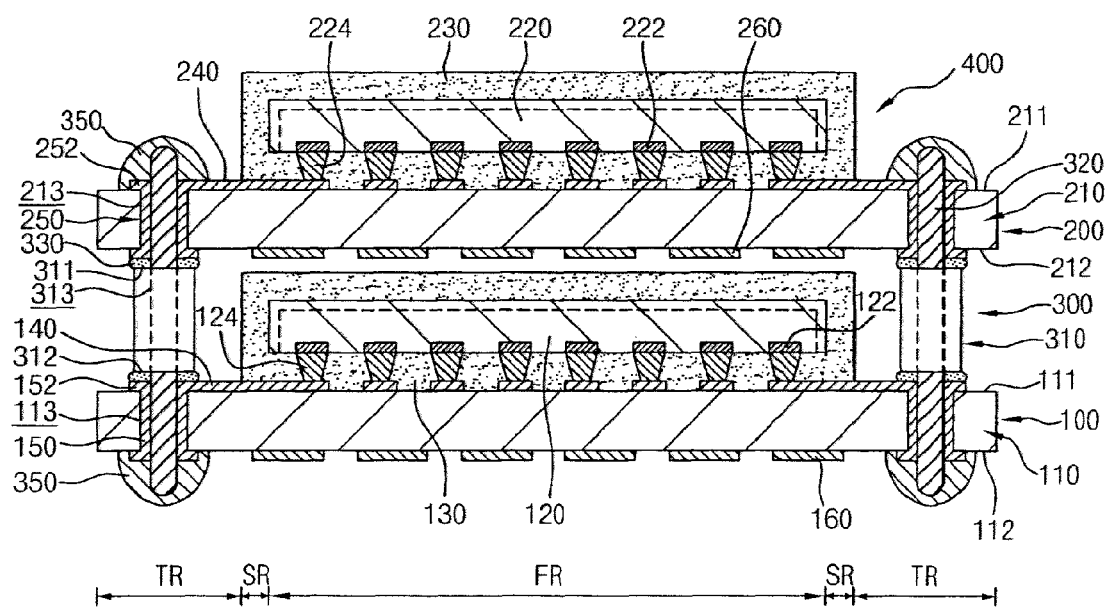
FIG. 10 is a cross-sectional view showing a stacked semiconductor package in accordance with another embodiment of the present invention.

FIG. 10 is a cross-sectional view showing a stacked semiconductor package in accordance with another embodiment of the present invention. The stacked semiconductor package according to the present embodiment can have substantially the same component parts as those of the stacked semiconductor package according to the embodiment of the present invention shown in FIG. 9, except for the conductive members of the connectors.

Referring to FIG. 10, a stacked semiconductor package 400 includes a first semiconductor package 100, a second semiconductor package 200, and connectors 300.

The first semiconductor package 100 includes a first substrate 110, a first semiconductor chip 120, a first molding member 130, first wiring lines 140, and first connection patterns 150 having first holes.

The second semiconductor package 200 includes a second substrate 210, a second semiconductor chip 220, a second molding member 230, second wiring lines 240, and second connection patterns 250 having second holes.

Each connector 300 includes a connector body 310 and a conductive member 320, which is inserted through a through-hole defined in the connector body 310 and has the shape of a pin.

In the present embodiment, one end (referred to as a first end) of each conductive member 320 is inserted into the first hole of the corresponding first connection pattern 150, and the other end (referred to as a second end) of the conductive member 320, which faces away from the one end, is inserted into the second hole of the corresponding second connection pattern 250.

In the present embodiment, the first end of the conductive member 320, which is inserted into the first hole, and the second end of the conductive member 320, which is inserted into the second hole, project respectively out of the first hole and the second hole by a predetermined distance.

Both ends of the conductive member 320 (which project out of the first and second holes by the predetermined distance) are electrically insulated from each other by insulation members 350. In the present embodiment, the insulation members 350 can comprise, for example, a synthetic resin such as epoxy resin or an organic material.

Figure 11:
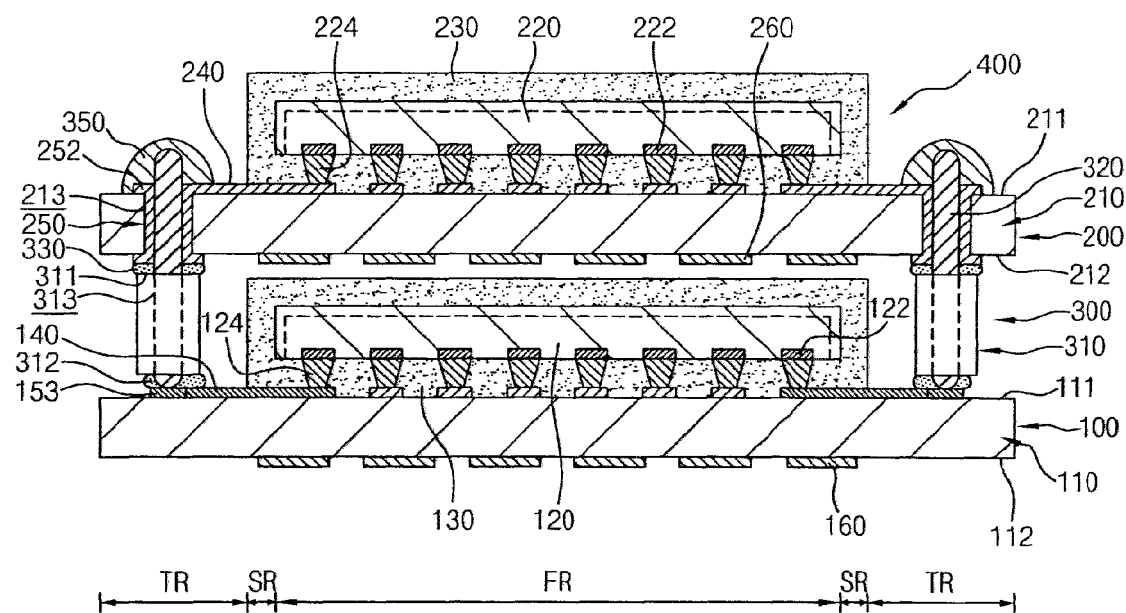
FIG. 11 is a cross-sectional view showing a stacked semiconductor package in accordance with another embodiment of the present invention.

FIG. 11 is a cross-sectional view showing a stacked semiconductor package in accordance with another embodiment of the present invention.

Referring to FIG. 11, a stacked semiconductor package 400 includes a first semiconductor package 100, a second semiconductor package 200, and connectors 300.

The first semiconductor package 100 includes a first substrate 110, a first semiconductor chip 120, a first molding member 130, first wiring lines 140, and first connection patterns 153.

The first substrate 110 has the shape of, for example, a rectangular hexahedral plate. The first substrate 110 (which has, for example, the shape of a rectangular hexahedral plate) has an upper surface 111 and a lower surface 112 facing away from the upper surface 111.

The first substrate 110 is divided into a first region FR, a second region SR, and a third region TR.

When viewing the first substrate 110 from the top, the first region FR is defined at the center portion of the first substrate 110. For example, the first region FR has a transverse sectional shape and a surface area corresponding to (or the same as) those of the first semiconductor chip 120, which is described later in more detail.

The second region SR is defined around the first region FR in the shape of a rectangular band. The first molding member 130 (which will be described later in more detail) is disposed in the first and second regions FR and SR to cover the first semiconductor chip 120.

The third region TR is defined around the second region SR.

A plurality of the first wiring lines 140 are disposed on the upper surface 111 of the first substrate 110. The first wiring lines 140 (having the plural number) extend, for example, from the first region FR to the third region TR of the first substrate 110.

The first connection patterns 153 are disposed in the third region TR of the first substrate 110. In more detail, in the present embodiment, the first connection patterns 153 are disposed on the upper surface 111 of the first substrate 110 and have the sectional shape of a pad. In the present embodiment, the first connection patterns 153 have the shape of a disc or a polygonal plate when viewed from the top.

In the present embodiment, the first wiring lines 140 and the first connection patterns 153, which correspond respectively to the first wiring lines 140, may be formed, for example, integrally with each other. Examples of a material that can be used to form the first wiring lines 140 and the first connection patterns 153 include copper, copper alloy, aluminum, and aluminum alloy.

The first semiconductor chip 120 is disposed, for example, in the first region FR on the upper surface 111 of the first substrate 110. In the present embodiment, the first semiconductor chip 120 can comprise, for example, a NAND memory chip.

The first semiconductor chip 120 includes a first circuit section (not shown), a plurality of first bonding pads 122, and a plurality of first bumps 124.

The first circuit section has a data storage unit (not shown) for storing data and a data processing unit (not shown) for processing data.

The first bonding pads 122 of the first semiconductor chip 120 face the first wiring lines 140 and are electrically connected to the first circuit section. The first bonding pads 122 are disposed, for example, along the edges of the first semiconductor chip 120. The first bonding pads 122 are disposed at positions corresponding respectively to the ends of the first wiring lines 140 disposed in the first region FR.

The first bumps 124 are interposed respectively between the first bonding pads 122 and the first wiring lines 140 corresponding respectively to the first bonding pads 122, by which the first bonding pads 122 and the first wiring lines 140 are connected to each other in a flip chip manner.

The first molding member 130 is disposed on the upper surface 111 of the first substrate 110. The first molding member 130 covers the first region FR and the second region SR of the first substrate 110, and thereby, the first semiconductor chip 120 disposed in the first region FR is covered by the first molding member 130. In the present embodiment, the first molding member 130 can be formed of, for example, an epoxy resin.

Ball land patterns 160 are formed on the lower surface 112 of the first substrate 110 and are electrically connected to the first connection patterns 153. Alternatively, the ball land patterns 160 can be electrically connected to the first wiring lines 140 through the first substrate 110.

Referring again to FIG. 11, the second semiconductor package 200 includes a second substrate 210, a second semiconductor chip 220, a second molding member 230, second wiring lines 240, and second connection patterns 250.

The second substrate 210 has the shape of, for example, a rectangular hexahedral plate. The second substrate 210 (which has, for example, the shape of a rectangular hexahedral plate) has an upper surface 211 and a lower surface 212 facing away from the upper surface 211. In the present embodiment, the second substrate 210 is positioned over the first substrate 110, and the upper surface 111 of the first substrate 110 faces the lower surface 212 of the second substrate 210.

The second substrate 210 is divided into a first region FR, a second region SR, and a third region TR. The first through third regions FR, SR and TR of the second substrate 210 are substantially the same as (e.g., substantially aligned with) the first through third regions FR, SR and TR of the first substrate 110.

When viewing the second substrate 210 from the top, the first region FR is defined at the center portion of the second substrate 210. For example, the first region FR has a transverse sectional shape and a surface area corresponding to (or the same as) those of the second semiconductor chip 220 which will be described later in more detail.

The second region SR is defined around the first region FR in the shape of a rectangular band. The second molding member 230 (which will be described later in more detail) is disposed in the first and second regions FR and SR to cover the second semiconductor chip 220.

The third region TR is defined around the second region SR.

A plurality of the second wiring lines 240 are disposed on the upper surface 211 of the second substrate 210. The second wiring lines 240 (having the plural number) extend, for example, from the first region FR to the third region TR of the second substrate 210.

The second connection patterns 250 are disposed in the third region TR of the second substrate 210. In the present embodiment, the second connection patterns 250 are disposed in through-holes 213, which are defined to pass through the second substrate 210 extending from the upper surface 211 to the lower surface 212. Each of the second connection patterns 250 is disposed in a corresponding one of the through-holes 213 and each has the shape of a pipe having a hole. The second connection patterns 250 include pad parts 252. The pad parts 252 extend from the second connection patterns 250 disposed in the through-holes 213 to and along the upper surface 211 and the lower surface 212 of the second substrate 210, respectively. In the present embodiment, the pad parts 252, which are disposed on the upper surface 211 and the lower surface 212 of the second substrate 210, can have the shape of a donut when viewed from the top and the bottom, respectively.

In the present embodiment, the second connection patterns 250 of the second substrate 210 are disposed at positions that face the first connection patterns 153 of the first substrate 110.

In the present embodiment, the second wiring lines 240, the second connection patterns 250, and the pad parts 252 (which correspond respectively to the second wiring lines 240) may be formed, for example, integrally with one another. Examples of a material that can be used to form the second wiring lines 240 and the second connection patterns 250 include copper, copper alloy, aluminum, and aluminum alloy.

The second semiconductor chip 220 is disposed, for example, in the first region FR on the upper surface 211 of the second substrate 210. In the present embodiment, the second semiconductor chip 220 can comprise, for example, a NAND memory chip. Alternatively, the second semiconductor chip 220 can comprise a system semiconductor chip.

The second semiconductor chip 220 includes a second circuit section (not shown), a plurality of second bonding pads 222, and a plurality of second bumps 224.

The second circuit section has a data storage unit (not shown) for storing data and a data processing unit (not shown) for processing data.

The second bonding pads 222 are electrically connected to the second circuit section. The second bonding pads 222 are disposed, for example, along the edges of the second semiconductor chip 220. The second bonding pads 222 are disposed at positions corresponding respectively to ends of the second wiring lines 240 disposed in the first region FR.

The second bumps 224 are interposed respectively between the second bonding pads 222 and the second wiring lines 240 corresponding respectively to the second bonding pads 222, by which the second bonding pads 222 and the second wiring lines 240 are connected to each other in a flip chip manner.

The second molding member 230 is disposed on the upper surface 211 of the second substrate 210. The second molding member 230 covers the first region FR and the second region SR of the second substrate 210, and thereby, the second semiconductor chip 220 disposed in the first region FR is covered by the second molding member 230.

Ball land patterns 260 are formed on the lower surface 212 of the second substrate 210 and are electrically connected to the second connection patterns 250. Alternatively, the ball land patterns 260 can be electrically connected to the second wiring lines 240 through the second substrate 210.

The connectors 300 are interposed between the first semiconductor package 100 and the second semiconductor package 200. The connectors 300 electrically connect the first and second semiconductor packages 100 and 200 to each other.

Each connector 300 includes a connector body 310 and a conductive member 320.

The connector body 310 may have the shape of, for example, a square column. The connector body 310 can be formed of an insulation material such as synthetic resin. The connector body 310 has a first surface 311 facing the lower surface 212 of the second substrate 210 and a second surface 312 facing the upper surface 111 of the first substrate 110. The connector body 310 also includes a through-hole 313 which passes through the connector body 310 from the first surface 311 to the second surface 312. The through-holes 313 of the connector bodies 310 are defined, for example, at positions corresponding to (or aligned with) the respective first connection patterns 153 of the first substrate 110 and the respective second connection patterns 250 of the second substrate 210 (for example, a connector body 310 can be aligned with a corresponding one of the first connection patterns 153 and a corresponding one of the second connection patterns 250).

In the present embodiment, the respective conductive members 320 have the shape of a pin. The conductive member 320 (which has the shape of a pin) is disposed in the through-hole 313 defined in the connector body 310. Both ends of the conductive member 320 project out of the connector body 310.

One end (referred to as a first end) of each conductive member 320 is connected to the surface of a corresponding first connection pattern 153 of the first substrate 110, and the other end (referred to as a second end) of each conductive member 320, which faces away from the first end, is inserted into the hole of a corresponding second connection pattern 250 of the second substrate 210. As a result, the conductive member 320 is electrically connected to the first and second connection patterns 153 and 250.

The second end of the conductive member 320, which is inserted into the hole of the second connection pattern 250, can pass through the hole and project out of the upper surface 211 of the second substrate 210 by a predetermined distance. Alternatively, the second end of the conductive member 320, which is inserted into the hole of the second connection pattern 250, can be disposed within the hole without projecting out of the upper surface 211.

Connection members 330, which have a low melting point, are interposed respectively between the connector bodies 310 and the first connection patterns 153 and between the connector bodies 310 and the pad parts 252 of the second connection pattern 250. The connection members 330 can comprise, for example, solders.

The stacked semiconductor package 400 according to the present embodiment may also include insulation members 350 which cover and insulate both ends of the respective conductive member 320. The insulation members 350 can comprise, for example, a synthetic resin such as epoxy resin or an organic material.

Figure 12:
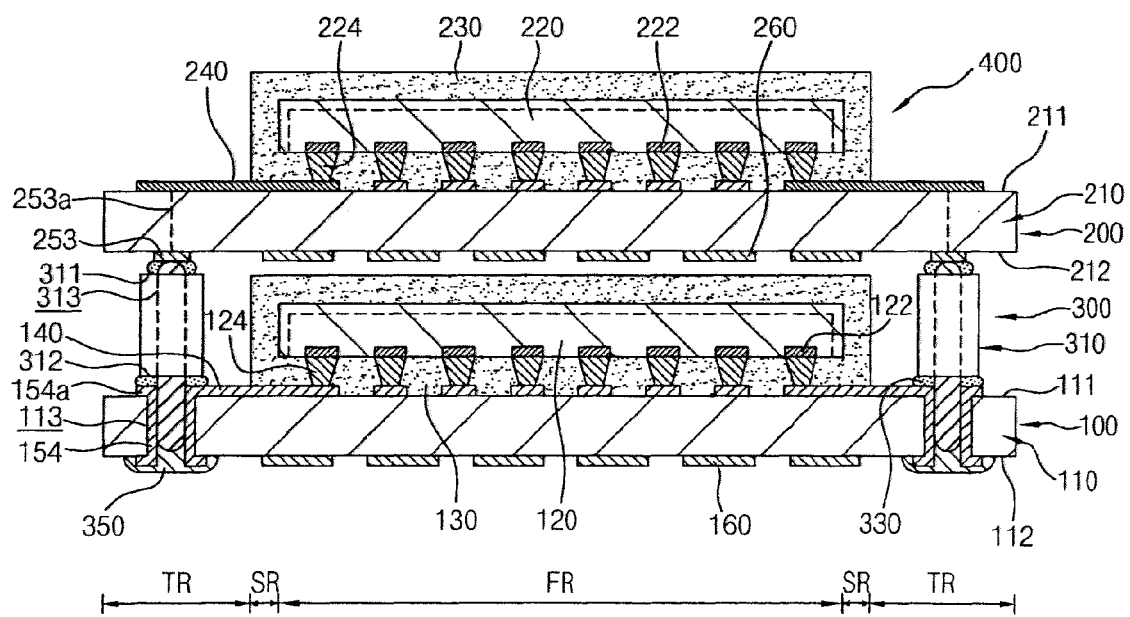
FIG. 12 is a cross-sectional view showing a stacked semiconductor package in accordance with another embodiment of the present invention.

FIG. 12 is a cross-sectional view showing a stacked semiconductor package in accordance with another embodiment of the present invention.

Referring to FIG. 12, a stacked semiconductor package 400 includes a first semiconductor package 100, a second semiconductor package 200, and connectors 300.

The first semiconductor package 100 includes a first substrate 110, a first semiconductor chip 120, a first molding member 130, first wiring lines 140, and first connection patterns 154.

The first substrate 110 has the shape of, for example, a rectangular hexahedral plate. The first substrate 110 (which has, for example, the shape of a rectangular hexahedral plate) has an upper surface 111 and a lower surface 112 which facing from the upper surface 111.

The first substrate 110 is divided into a first region FR, a second region SR, and a third region TR.

When viewing the first substrate 110 from the top, the first region FR is defined at the center portion of the first substrate 110. For example, the first region FR has a transverse sectional shape and a surface area corresponding to (or the same as) those of the first semiconductor chip 120, which is described later in more detail.

The second region SR is defined around the first region FR in the shape of a rectangular band. The first molding member 130 (which will be described later in more detail) is disposed in the first and second regions FR and SR to cover the first semiconductor chip 120.

The third region TR is defined around the second region SR.

A plurality of the first wiring lines 140 are disposed on the upper surface 111 of the first substrate 110. The first wiring lines 140 (having the plural number) extend, for example, from the first region FR to the third region TR of the first substrate 110.

The first connection patterns 154 are disposed in the third region TR of the first substrate 110. In the present embodiment, the first connection patterns 154 are disposed in through-holes 113, which are defined to pass through the first substrate 100 extending from the upper surface 111 to the lower surface 112 facing away from the upper surface 111. The respective first connection patterns 154 have the shape of a pipe having a hole. The first connection patterns 154 include pad parts 154a. The pad parts 154a extend from the first connection patterns 154 to and along the upper surface 111 and the lower surface 112 of the first substrate 110, respectively. The respective pad parts 154a can have the shape of a donut when viewed from the top and the bottom.

In the present embodiment, the first wiring lines 140 and the first connection patterns 154 (which correspond respectively to the first wiring lines 140), are formed, for example, integrally with each other. Examples of a material that can be used to form the first wiring lines 140 and the first connection patterns 154 include copper, copper alloy, aluminum, and aluminum alloy.

The first semiconductor chip 120 is disposed, for example, in the first region FR on the upper surface 111 of the first substrate 110. In the present embodiment, the first semiconductor chip 120 can comprise, for example, a NAND memory chip.

The first semiconductor chip 120 includes a first circuit section (not shown), a plurality of first bonding pads 122, and a plurality of first bumps 124.

The first circuit section has a data storage unit (not shown) for storing data and a data processing unit (not shown) for processing data.

The first bonding pads 122 of the first semiconductor chip 120 face the first wiring lines 140 and are electrically connected to the first circuit section. The first bonding pads 122 are disposed, for example, along the edges of the first semiconductor chip 120. The first bonding pads 122 are disposed at positions corresponding respectively to the ends of the first wiring lines 140 disposed in the first region FR.

The first bumps 124 are interposed respectively between the first bonding pads 122 and the first wiring lines 140 corresponding respectively to the first bonding pads 122, by which the first bonding pads 122 and the first wiring lines 140 are connected to each other in a flip chip manner.

The first molding member 130 is disposed on the upper surface 111 of the first substrate 110. The first molding member 130 covers the first region FR and the second region SR of the first substrate 110, and thereby, the first semiconductor chip 120 disposed in the first region FR is covered by the first molding member 130. In the present embodiment, the first molding member 130 can be formed of, for example, an epoxy resin.

Ball land patterns 160 are formed on the lower surface 112 of the first substrate 110 and are electrically connected to the first connection patterns 154. Alternatively, the ball land patterns 160 can be electrically connected to the first wiring lines 140 through the first substrate 110.

Referring again to FIG. 12 again, the second semiconductor package 200 includes a second substrate 210, a second semiconductor chip 220, a second molding member 230, second wiring lines 240, second connection patterns 253, and connection vias 253a.

The second substrate 210 has the shape of, for example, a rectangular hexahedral plate. The second substrate 210 (which has the shape of, for example, a rectangular hexahedral plate) has an upper surface 211 and a lower surface 212 facing away from the upper surface 211. In the present embodiment, the second substrate 210 is positioned over the first substrate 110, and the upper surface 111 of the first substrate 110 faces the lower surface 212 of the second substrate 210.

The second substrate 210 is divided into a first region FR, a second region SR, and a third region TR. The first through third regions FR, SR and TR of the second substrate 210 are substantially the same as (e.g., substantially aligned with) the first through third regions FR, SR and TR of the first substrate 110.

When viewing the second substrate 210 from the top, the first region FR is defined at the center portion of the second substrate 210. For example, the first region FR has a transverse sectional shape and a surface area corresponding to (or the same as) those of the second semiconductor chip 220 which will be described later in more detail.

The second region SR is defined around the first region FR in the shape of a rectangular band. The second molding member 230 (which will be described later in more detail) is disposed in the first and second regions FR and SR to cover the second semiconductor chip 220.

The third region TR is defined around the second region SR.

A plurality of the second wiring lines 240 are disposed on the upper surface 211 of the second substrate 210. The second wiring lines 240 (having the plural number) extend, for example, from the first region FR to the third region TR of the second substrate 210.

The second connection patterns 253 are disposed in the third region TR of the second substrate 210. In the present embodiment, the second connection patterns 253 are disposed on the lower surface 212 of the second substrate 210 facing the upper surface 111 of the first substrate 110. The second connection patterns 253 have the shape of a circular pad or a polygonal pad when viewed from the top. In the present embodiment, the second connection patterns 253, which are formed on the lower surface 212 of the second substrate 210, are disposed such that they face the first connection patterns 154 of the first substrate 110.

The connection vias 253a pass through the second substrate from the lower surface 212 to the upper surface 211 and are electrically connected to the second wiring lines 240.

In the present embodiment, the second wiring lines 240 and the second connection patterns 253, which correspond respectively to the second wiring lines 240 (e.g., each second wiring line 240 corresponds to a second connection pattern 253), are formed, for example, integrally with each other. Examples of a material that can be used to form the second wiring lines 240 and the second connection patterns 253 include copper, copper alloy, aluminum, and aluminum alloy.

The second semiconductor chip 220 is disposed, for example, in the first region FR on the upper surface 211 of the second substrate 210. In the present embodiment, the second semiconductor chip 220 can comprise, for example, a NAND memory chip. Alternatively, the second semiconductor chip 220 can comprise a system semiconductor chip.

The second semiconductor chip 220 includes a second circuit section (not shown), a plurality of second bonding pads 222, and a plurality of second bumps 224.

The second circuit section has a data storage unit (not shown) for storing data and a data processing unit (not shown) for processing data.

The second bonding pads 222 are electrically connected to the second circuit section. The second bonding pads 222 are disposed, for example, along the edges of the second semiconductor chip 220. The second bonding pads 222 are disposed at positions corresponding respectively to the ends of the second wiring lines 240 disposed in the first region FR.

The second bumps 224 are interposed respectively between the second bonding pads 222 and the second wiring lines 240 corresponding respectively to the second bonding pads 222, by which the second bonding pads 222 and the second wiring lines 240 are connected to each other in a flip chip manner.

The second molding member 230 is disposed on the upper surface 211 of the second substrate 210. The second molding member 230 covers the first region FR and the second region SR of the second substrate 210, and thereby, the second semiconductor chip 220 disposed in the first region FR is covered by the second molding member 230. In the present embodiment, the second molding member 230 can be formed of, for example, an epoxy resin.

Ball land patterns 260 are formed on the lower surface 212 of the second substrate 210 and are electrically connected to the second connection patterns 253. Alternatively, the ball land patterns 260 can be electrically connected to the second wiring lines 240 through the second substrate 210.

The connectors 300 are interposed between the first semiconductor package 100 and the second semiconductor package 200. The connectors 300 electrically connect the first and second semiconductor packages 100 and 200 to each other.

Each connector 300 includes a connector body 310 and a conductive member 320.

The connector body 310 may have the shape of, for example, a square column. The connector body 310 can be formed of an insulation material such as synthetic resin. The connector body 310 has a first surface 311 facing the lower surface 212 of the second substrate 210 and a second surface 312 facing the upper surface 111 of the first substrate 110. The connector body 310 also includes a through-hole 313 which passes through the connector body from the first surface 311 to the second surface 312. The through-holes 313 of the connector bodies 310 are defined, for example, at positions corresponding to (or aligned with) the respective first connection patterns 154 of the first substrate 110 and the respective second connection patterns 253 of the second substrate 210

(for example, a connector body 310 can be aligned with a corresponding one of the first connection patterns 150 and a corresponding one of the second connection patterns 250).

In the present embodiment, the respective conductive members 320 have the shape of a pin. The conductive member 320 (which has the shape of a pin) is disposed in the through-hole 313 defined in the connector body 310. Both ends of the conductive member 320 project out of the connector body 310.

One end (referred to as a first end) of each conductive member 320 is inserted into the hole of a corresponding first connection pattern 154 of the first substrate 110, and the other end (referred to as a second end) of each conductive member 320, which faces away from the one end, is connected to the surface of a corresponding second connection pattern 253 of the second substrate 210.

The first end of the conductive member 320, which is inserted into the hole of the first connection pattern 154, can pass through the hole and project out of the lower surface 112 of the first substrate 110 by a predetermined distance. Alternatively, the first end of the conductive member 320, which is inserted into the hole of the first connection pattern 154, can be placed within the hole such that is does not project out of the lower surface 112 of the first substrate 110.

Connection members 330, which have a low melting point, are interposed respectively between the connector bodies 310 and the first connection patterns 154 and between the connector bodies 310 and the second connection pattern 253. The connection members 330 can comprise, for example, solders.

The stacked semiconductor package 400 according to the present embodiment may also include insulation members 350 each of which covers and insulates the one end of the respective conductive member 320. The insulation members 350 can be formed of, for example, a synthetic resin such as epoxy resin or an organic material.

Figure 13:
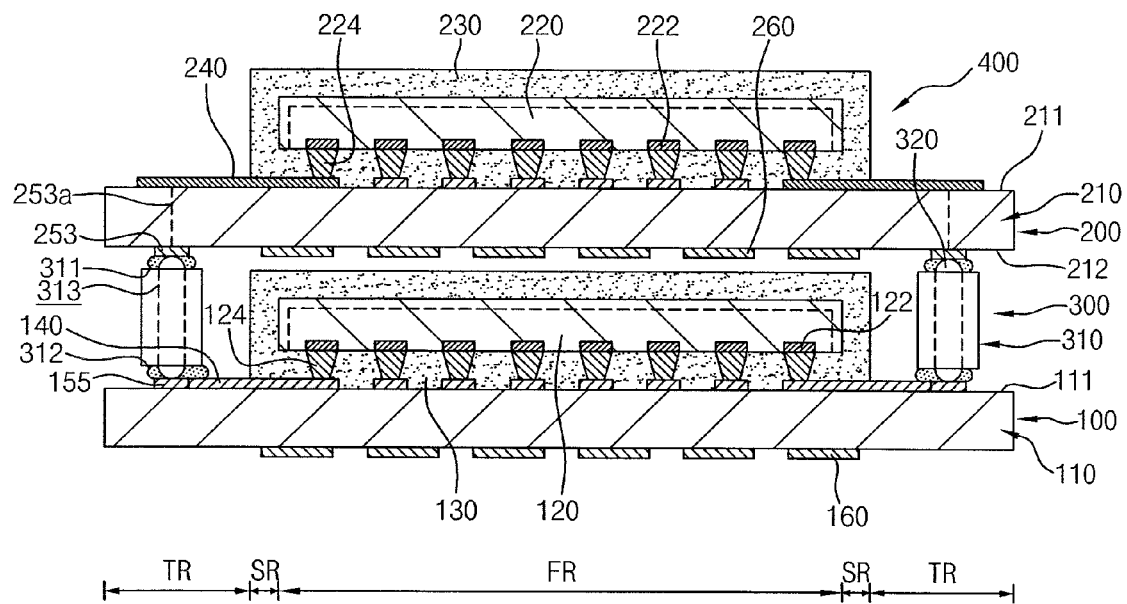
FIG. 13 is a cross-sectional view showing a stacked semiconductor package in accordance with another embodiment of the present invention.

FIG. 13 is a cross-sectional view showing a stacked semiconductor package in accordance with another embodiment of the present invention.

Referring to FIG. 13, a stacked semiconductor package 400 includes a first semiconductor package 100, a second semiconductor package 200, and connectors 300.

The first semiconductor package 100 includes a first substrate 110, a first semiconductor chip 120, a first molding member 130, first wiring lines 140, and first connection patterns 155.

The first substrate 110 has the shape of, for example, a rectangular hexahedral plate. The first substrate 110 (which has, for example, the shape of a rectangular hexahedral plate) has an upper surface 111 and a lower surface 112 facing away from the upper surface 111.

The first substrate 110 is divided into a first region FR, a second region SR, and a third region TR.

When viewing the first substrate 110 from the top, the first region FR is defined at the center portion of the first substrate 110. For example, the first region FR has a transverse sectional shape and a surface area corresponding to (or the same as) those of the first semiconductor chip 120, which is described later in more detail.

The second region SR is defined around the first region FR in the shape of a rectangular band. The first molding member 130 (which will be described later in more detail) is disposed in the first and second regions FR and SR to cover the first semiconductor chip 120.

The third region TR is defined around the second region SR.

A plurality of the first wiring lines 140 are disposed on the upper surface 111 of the first substrate 110. The first wiring lines 140 (having the plural number) extend, for example, from the first region FR to the third region TR of the first substrate 110.

The first connection patterns 155 are disposed in the third region TR of the first substrate 110. In more detail, in the present embodiment, the first connection patterns 155 are disposed on the upper surface 111 of the first substrate 110 and have the sectional shape of a pad. The first connection patterns 155 can have the shape of a circular pad or a polygonal pad when viewed from the top.

In the present embodiment, the first wiring lines 140 and the first connection patterns 155, which correspond respectively to the first wiring lines 140, may be formed, for example, integrally with each other. Examples of a material that can be used to form the first wiring lines 140 and the first connection patterns 155 include copper, copper alloy, aluminum, and aluminum alloy.

The first semiconductor chip 120 is disposed, for example, in the first region FR on the upper surface 111 of the first substrate 110. In the present embodiment, the first semiconductor chip 120 can comprise, for example, a NAND memory chip.

The first semiconductor chip 120 includes a first circuit section (not shown), a plurality of first bonding pads 122, and a plurality of first bumps 124.

The first circuit section has a data storage unit (not shown) for storing data and a data processing unit (not shown) for processing data.

The first bonding pads 122 of the first semiconductor chip 120 face the first wiring lines 140 and are electrically connected to the first circuit section. The first bonding pads 122 are disposed, for example, along the edges of the first semiconductor chip 120. The first bonding pads 122 are disposed at positions corresponding respectively to the ends of the first wiring lines 140 disposed in the first region FR.

The first bumps 124 are interposed respectively between the first bonding pads 122 and the first wiring lines 140 corresponding respectively to the first bonding pads 122, by which the first bonding pads 122 and the first wiring lines 140 are connected to each other in a flip chip manner.

The first molding member 130 is disposed on the upper surface 111 of the first substrate 110. The first molding member 130 covers the first region FR and the second region SR of the first substrate 110, and thereby, the first semiconductor chip 120 disposed in the first region FR is covered by the first molding member 130. In the present embodiment, the first molding member 130 can be formed of, for example, an epoxy resin.

Ball land patterns 160 are formed on the lower surface 112 of the first substrate 110 and are electrically connected to the first connection patterns 155. Alternatively, the ball land patterns 160 can be electrically connected to the first wiring lines 140 through the first substrate 110.

Referring to again FIG. 13, the second semiconductor package 200 includes a second substrate 210, a second semiconductor chip 220, a second molding member 230, second wiring lines 240, second connection patterns 253, and connection vias 253a.

The second substrate 210 has the shape of, for example, a rectangular hexahedral plate. The second substrate 210 (which has the shape of a rectangular hexahedral plate) has an upper surface 211 and a lower surface 212 facing away from the upper surface 211. In the present embodiment, the second substrate 210 is positioned over the first substrate 110, and the upper surface 111 of the first substrate 110 faces the lower surface 212 of the second substrate 210.

The second substrate 210 is divided into a first region FR, a second region SR, and a third region TR. The first through third regions FR, SR and TR of the second substrate 210 are substantially the same as (e.g., substantially aligned with) the first through third regions FR, SR and TR of the first substrate 110.

When viewing second substrate 210 from the top, the first region FR is defined at the center portion of the second substrate 210. For example, the first region FR has a transverse sectional shape and a surface area corresponding to (or the same as) those of the second semiconductor chip 220 which will be described later in more detail.

The second region SR is defined around the first region FR in the shape of a rectangular band. The second molding member 230 (which will be described later in more detail) is disposed in the first and second regions FR and SR to cover the second semiconductor chip 220.

The third region TR is defined around the second region SR.

A plurality of the second wiring lines 240 are disposed on the upper surface 211 of the second substrate 210. The second wiring lines 240 (having the plural number) extend, for example, from the first region FR to the third region TR of the second substrate 210.

The second connection patterns 253 are disposed in the third region TR of the second substrate 210. In the present embodiment, the second connection patterns 253 are disposed on the lower surface 212 of the second substrate 210 facing the upper surface 111 of the first substrate 110. The second connection patterns 253 may have the shape of a circular pad or a polygonal pad when viewed from the top. In the present embodiment, the second connection patterns 253, which are formed on the lower surface 212 of the second substrate 210, are disposed such that they face the first connection patterns 155 of the first substrate 110.

The connection vias 253a pass through the second substrate from the lower surface 212 to the upper surface 211 and are electrically connected to the second wiring lines 240.

In the present embodiment, the second wiring lines 240 and the second connection patterns 253, which correspond respectively to the second wiring lines 240, are formed, for example, integrally with each other. Examples of a material that can be used to form the second wiring lines 240 and the second connection patterns 253 include copper, copper alloy, aluminum, and aluminum alloy.

The second semiconductor chip 220 is disposed, for example, in the first region FR on the upper surface 211 of the second substrate 210. In the present embodiment, the second semiconductor chip 220 can comprise, for example, a NAND memory chip. Alternatively, the second semiconductor chip 220 can comprise a system semiconductor chip.

The second semiconductor chip 220 includes a second circuit section (not shown), a plurality of second bonding pads 222, and a plurality of second bumps 224.

The second circuit section has a data storage unit (not shown) for storing data and a data processing unit (not shown) for processing data.

The second bonding pads 222 are electrically connected to the second circuit section. The second bonding pads 222 are disposed, for example, along the edges of the second semiconductor chip 220. The second bonding pads 222 are disposed at positions corresponding respectively to ends of the second wiring lines 240 disposed in the first region FR.

The second bumps 224 are interposed respectively between the second bonding pads 222 and the second wiring lines 240 corresponding respectively to the second bonding pads 222, by which the second bonding pads 222 and the second wiring lines 240 are connected to each other in a flip chip manner.

The second molding member 230 is disposed on the upper surface 211 of the second substrate 210. The second molding member 230 covers the first region FR and the second region SR of the second substrate 210, and thereby, the second semiconductor chip 220 disposed in the first region FR is covered by the second molding member 230.

Ball land patterns 260 are formed on the lower surface 212 of the second substrate 210 and are electrically connected to the second connection patterns 253. Alternatively, the ball land patterns 260 can be electrically connected to the second wiring lines 240 through the second substrate 210.

The connectors 300 are interposed between the first semiconductor package 100 and the second semiconductor package 200. The connectors 300 electrically connect the first and second semiconductor packages 100 and 200 to each other.

Each connector 300 includes a connector body 310 and a conductive member 320.

The connector body 310 may have the shape of, for example, a square column. The connector body 310 can be formed of an insulation material such as synthetic resin. The connector body 310 has a first surface 311 facing the lower surface 212 of the second substrate 210 and a second surface 312 facing the upper surface 111 of the first substrate 110. The connector body 310 further also includes a through-hole 313 which passes through the connector body from the first surface 311 to the second surface 312. The through-holes 313 of the connector bodies 310 are defined, for example, at positions corresponding to (or aligned with) the respective first connection patterns 155 of the first substrate 110 and the respective second connection patterns 253 of the second substrate 210 (for example, a connector body 310 can be aligned with a corresponding one of the first connection patterns 155 and a corresponding one of the second connection patterns 253).

In the present embodiment, the respective conductive members 320 have the shape of a pin. The conductive member 320 (which has the shape of a pin) is disposed in the through-hole 313 defined in the connector body 310. Both ends of the conductive member 320 project out of the connector body 310.

One end (referred to as a first end) of each conductive member 320 is disposed on a corresponding first connection pattern 155 of the first substrate 110, and the other end (referred to as a second end) of each conductive member 320, which faces away from the one end, is connected to the surface of a corresponding second connection pattern 253 of the second substrate 210.

Connection members 330, which have a low melting point, are interposed respectively between the connector bodies 310 and the first connection patterns 155 and between the connector bodies and the second connection patterns 253. The connection members 330 can comprise, for example, solders.

Figure 14:
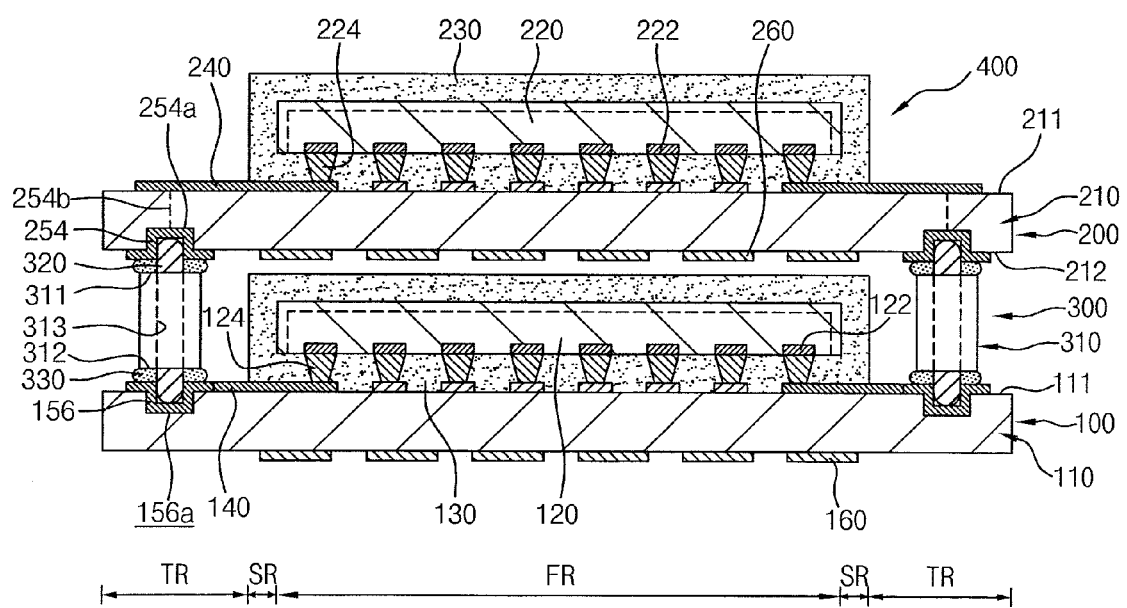
FIG. 14 is a cross-sectional view showing a stacked semiconductor package in accordance with another embodiment of the present invention.

FIG. 14 is a cross-sectional view showing a stacked semiconductor package in accordance with another embodiment of the present invention.

Referring to FIG. 14, a stacked semiconductor package 400 includes a first semiconductor package 100, a second semiconductor package 200, and connectors 300.

The first semiconductor package 100 includes a first substrate 110, a first semiconductor chip 120, a first molding member 130, first wiring lines 140, and first connection patterns 156.

The first substrate 110 has the shape of, for example, a rectangular hexahedral plate. The first substrate 110 (which has the shape of, or example, a rectangular hexahedral plate) has an upper surface 111 and a lower surface 112 facing away from the upper surface 111.

The first substrate 110 is divided into a first region FR, a second region SR, and a third region. TR.

When viewing the first substrate 110 from the top, the first region FR is defined at the center portion of the first substrate 110. For example, the first region FR has a transverse sectional shape and a surface area corresponding to (or the same as) those of the first semiconductor chip 120, which is described later in more detail.

The second region SR is defined around the first region FR in the shape of a rectangular band. The first molding member 130 (which will be described later in more detail) is disposed in the first and second regions FR and SR to cover the first semiconductor chip 120.

The third region TR is defined around the second region SR.

A plurality of the first wiring lines 140 are disposed on the upper surface 111 of the first substrate 110. The first wiring lines 140 (having the plural number) extend, for example, from the first region FR to the third region TR of the first substrate 110.

The first connection patterns 156 are disposed in the third region TR of the first substrate 110. In the present embodiment, the first connection patterns 156 are disposed in first recesses 156a defined within the upper surface 111 of the first substrate 110 and having a predetermined depth when measured from the upper surface 111 of the first substrate 110. For example, the first connection patterns 156 are disposed on inner surfaces of the first substrate within the first recesses 156a, and the respective first connection patterns have the sectional shape of a cup.

In the present embodiment, the first wiring lines 140 and the first connection patterns 156 (which correspond to the first wiring lines 140) are formed, for example, integrally with each other. Examples of a material that can be used to form the first wiring lines 140 and the first connection patterns 156 include copper, copper alloy, aluminum, and aluminum alloy.

The first semiconductor chip 120 is disposed, for example, in the first region. FR on the upper surface 111 of the first substrate 110. In the present embodiment, the first semiconductor chip 120 can comprise, for example, a NAND memory chip.

The first semiconductor chip 120 includes a first circuit section (not shown), a plurality of first bonding pads 122, and a plurality of first bumps 124.

The first circuit section has a data storage unit (not shown) for storing data and a data processing unit (not shown) for processing data.

The first bonding pads 122 of the first semiconductor chip 120 face the first wiring lines 140 and are electrically connected to the first circuit section. The first bonding pads 122 are disposed, for example, along the edges of the first semiconductor chip 120. The first bonding pads 122 are disposed at positions corresponding respectively to the ends of the first wiring lines 140 disposed in the first region FR.

The first bumps 124 are interposed respectively between the first bonding pads 122 and the first wiring lines 140 corresponding respectively to the first bonding pads 122, by which the first bonding pads 122 and the first wiring lines 140 are connected to each other in a flip chip manner.

The first molding member 130 is disposed on the upper surface 111 of the first substrate 110. The first molding member 130 covers the first region FR and the second region SR of the first substrate 110, and thereby, the first semiconductor chip 120 disposed in the first region. FR is covered by the first molding member 130. In the present embodiment, the first molding member 130 can be formed of, for example, an epoxy resin.

Ball land patterns 160 are formed on the lower surface 112 of the first substrate 110 and are electrically connected to the first connection patterns 156. Alternatively, the ball land patterns 160 can be electrically connected to the first wiring lines 140 through the first substrate 110.

Referring again to FIG. 14, the second semiconductor package 200 includes a second substrate 210, a second semiconductor chip 220, a second molding member 230, second wiring lines 240, second connection patterns 254, and connection vias 254b.

The second substrate 210 has the shape of, for example, a rectangular hexahedral plate. The second substrate 210 (which has, for example the shape of a rectangular hexahedral plate) has an upper surface 211 and a lower surface 212 facing away from the upper surface 211. In the present embodiment, the second substrate 210 is positioned over the first substrate 110, and the upper surface 111 of the first substrate 110 faces the lower surface 212 of the second substrate 210.

The second substrate 210 is divided into a first region FR, a second region SR, and a third region TR. The first through third regions FR, SR and TR of the second substrate 210 are substantially the same as (e.g., substantially aligned with) the first through third regions FR, SR and TR of the first substrate 110.

When viewing the second substrate 210 from the top, the first region FR is defined at the center portion of the second substrate 210. For example, the first region FR has a transverse sectional shape and a surface area corresponding to (or the same as) those of the second semiconductor chip 220 which will be described later in more detail.

The second region SR is defined around the first region FR in the shape of a rectangular band. The second molding member 230 (which will be described later in more detail) is disposed in the first and second regions FR and SR to cover the second semiconductor chip 220.

The third region TR is defined around the second region SR.

The second wiring lines 240 are disposed on the upper surface 211 of the second substrate 210. The second wiring lines 240 (having the plural number) extend, for example, from the first region FR to the third region TR of the second substrate 210.

The second connection patterns 254 are disposed in the third region TR of the second substrate 210. In the present embodiment, the second connection patterns 254 are disposed in second recesses 254a defined within the lower surface 212 of the second substrate 210 and having a predetermined depth when measured from the lower surface 112 of the second substrate 110. The second connection patterns 254 can have the sectional shape of, for example, a cup. In the present embodiment, the second connection patterns 254, which are disposed within the second recesses formed in the lower surface 212 of the second substrate 210, are disposed such that they face the first connection patterns 156 of the first substrate 110.

The connection vias 254b pass through the second substrate 210 from the lower surface 212 to the upper surface 211 and electrically connect the second wiring lines 240 and the second connection patterns 254 to each other.

In the present embodiment, the second wiring lines 240, the second connection patterns 254, and the connection vias 254b, which correspond to the second wiring lines 240, are formed, for example, integrally with one another. Examples of a material that can be used to form the second wiring lines 240 and the second connection patterns 254 include copper, copper alloy, aluminum, and aluminum, alloy.

The second semiconductor chip 220 is disposed, for example, in the first region FR on the upper surface 211 of the second substrate 210. In the present embodiment, the second semiconductor chip 220 can comprise, for example, a NAND memory chip. Alternatively, the second semiconductor chip 220 can comprise a system semiconductor chip.

The second semiconductor chip 220 includes a second circuit section (not shown), a plurality of second bonding pads 222, and a plurality of second bumps 224.

The second circuit section has a data storage unit (not shown) for storing data and a data processing unit (not shown) for processing data.

The second bonding pads 222 are electrically connected to the second circuit section. The second bonding pads 222 are disposed, for example, along the edges of the second semiconductor chip 220. The second bonding pads 222 are disposed at positions corresponding respectively to the ends of the second wiring lines 240 disposed in the first region FR.

The second bumps 224 are interposed respectively between the second bonding pads 222 and the second wiring lines 240 corresponding respectively to the second bonding pads 222, by which the second bonding pads 222 and the second wiring lines 240 are connected to each other in a flip chip manner.

The second molding member 230 is disposed on the upper surface 211 of the second substrate 210. The second molding member 230 covers the first region FR and the second region SR of the second substrate 210, and thereby, the second semiconductor chip 220 disposed in the first region FR is covered by the second molding member 230. In the present embodiment, the second molding member 230 can be formed of, for example, an epoxy resin.

Ball land patterns 260 are formed on the lower surface 212 of the second substrate 210 and are electrically connected to the second connection patterns 254. Alternatively, the ball land patterns 260 can be electrically connected to the second wiring lines 240 through the second substrate 210.

The connectors 300 are interposed between the first semiconductor package 100 and the second semiconductor package 200. The connectors 300 electrically connect the first and second semiconductor packages 100 and 200 to each other.

Each connector 300 includes a connector body 310 and a conductive member 320.

The connector body 310 may have the shape of, for example, a square column. The connector body 310 can be formed of an insulation material such as synthetic resin. The connector body 310 has a first surface 311 facing the lower surface 212 of the second substrate 210 and a second surface 312 facing the upper surface 111 of the first substrate 110. The connector body 310 has also includes a through-hole 313 which passes through the connector body from the first surface 311 to the second surface 312. The through-holes 313 of the connector bodies 310 are defined, for example, at positions corresponding to (or aligned with) the respective first connection patterns 156 of the first substrate 110 and the respective second connection patterns 254 of the second substrate 210 (for example, a connector body can be aligned with a corresponding one of the first connection patterns 156 and a corresponding one of the second connection patterns 254).

In the present embodiment, the respective conductive members 320 have the shape of a pin. The conductive member 320 (which has the shape of a pin) is disposed in the through-hole 313 defined in the connector body 310. Both ends of the conductive member 320 project out of the connector body 310.

One end (referred to as a first end) of each conductive member 320 is inserted into a corresponding first connection pattern 156 of the first substrate 110 which has the sectional shape of a cup, and the other end (referred to as a second end) of each conductive member 320, which faces away from the first end, is inserted into a corresponding second connection pattern 254 of the second substrate 210.

Connection members 330, which have a low melting point, are respectively interposed respectively between connector bodies 310 and the first connection patterns 156 and between the connector bodies 310 and the second connection pattern 254. The connection members 330 can comprise, for example, solders.

Figure 15:
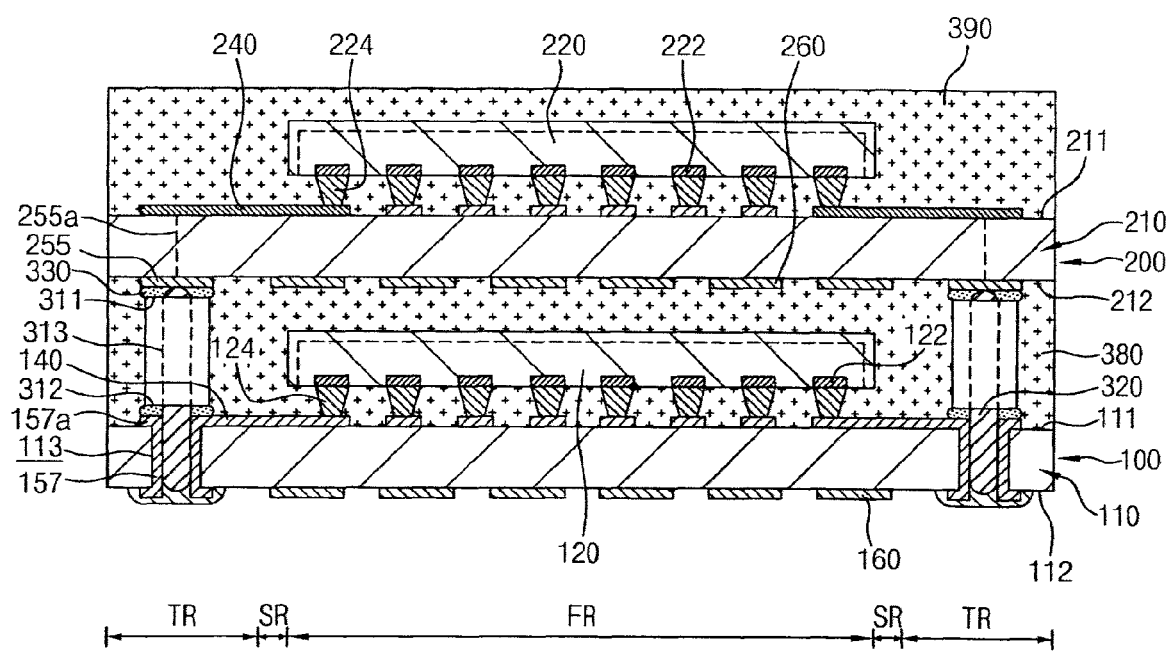
FIG. 15 is a cross-sectional view showing a stacked semiconductor package in accordance with another embodiment of the present invention.

FIG. 15 is a sectional view illustrating a stacked semiconductor package in accordance with another embodiment of the present invention.

Referring to FIG. 15, a stacked semiconductor package 400 includes a first semiconductor package 100, a second semiconductor package 200, connectors 300, a gap-fill member 380, and a molding member 390.

The first semiconductor package 100 includes a first substrate 110, a first semiconductor chip 120, first wiring lines 140, and first connection patterns 157.

The first substrate 110 has the shape of, for example, a rectangular hexahedral plate. The first substrate 110 (which has, for example, the shape of a rectangular hexahedral plate) has an upper surface 111 and a lower surface 112 facing away from the upper surface 111.

The first substrate 110 is divided into a first region FR, a second region SR, and a third region TR.

When viewing the first substrate 110 from the top, the first region FR is defined at the center portion of the first substrate 110. For example, the first region FR has a transverse sectional shape and a surface area corresponding to (or the same as) those of the first semiconductor chip 120 which will be described later in detail.

The second region SR is defined around the first region FR in the shape of a rectangular band.

A plurality of the first wiring lines 140 are disposed on the upper surface 111 of the first substrate 110. The first wiring lines 140 (having the plural number) extend, for example, from the first region FR to the third region TR of the first substrate 110.

The first connection patterns 157 are disposed in the third region TR of the first substrate 110. In the present embodiment, the first connection patterns 157 are disposed in a zigzag pattern when viewed from the top.

In the present embodiment, the first connection patterns 157 are disposed in through-holes 113 which are defined to pass through the first substrate from the upper surface 111 to the lower surface 112 facing away from the upper surface 111. The first connection patterns 157 have the shape of a pipe having a hole. The first connection patterns 157 include pad parts 157a. The pad parts 157a extend from the first connection patterns 157 to and along the upper surface 111 and the lower surface 112 of the first substrate 110. The pad parts 157a have the shape of a donut when viewed from the top and the bottom.

In the present embodiment, the first wiring lines 140 and the first connection patterns 157, which correspond respectively to the first wiring lines 140, are formed, for example, integrally with each other. Examples of a material that can be used to form the first wiring lines 140 and the first connection patterns 157 include copper, copper alloy, aluminum, and aluminum alloy.

The first semiconductor chip 120 is disposed, for example, in the first region FR on the upper surface 111 of the first substrate 110. In the present embodiment, the first semiconductor chip 120 can comprise, for example, a NAND memory chip.

The first semiconductor chip 120 includes a first circuit section (not shown), a plurality of first bonding pads 122, and a plurality of first bumps 124.

The first circuit section has a data storage unit (not shown) for storing data and a data processing unit (not shown) for processing data.

The first bonding pads 122 of the first semiconductor chip 120 face the first wiring lines 140 and are electrically connected with the first circuit section. The first bonding pads 122 are disposed, for example, along the edges of the first semiconductor chip 120. The first bonding pads 122 are disposed at positions that correspond respectively to the ends of the first wiring lines 140 disposed in the first region FR.

The first bumps 124 are interposed respectively between the first bonding pads 122 and the first wiring lines 140 corresponding respectively to the first bonding pads 122, by which the first bonding pads 122 and the first wiring lines 140 are connected to each other in a flip chip manner.

Ball land patterns 160 are formed on the lower surface 112 of the first substrate 110 to be electrically connected to the first connection patterns 157. Alternatively, the ball land patterns 160 can be electrically connected to the first wiring lines 140 through the first substrate 110.

Referring to FIG. 15 again, the second semiconductor package 200 includes a second substrate 210, a second semiconductor chip 220, second wiring lines 240, second connection patterns 255, and connection vias 255a.

The second substrate 210 has the shape of, for example, a rectangular hexahedral plate. The second substrate 210 (which has, for example, the shape of a rectangular hexahedral plate) has an upper surface 211 and a lower surface 212 facing away from the upper surface 211. In the present embodiment, the is second substrate 210 is positioned over the first substrate 110, and the upper surface 111 of the first substrate 110 faces the lower surface 212 of the second substrate 210.

The second substrate 210 is divided into a first region FR, a second region SR, and a third region TR. The first through third regions FR, SR and TR of the second substrate 210 are substantially the same as (e.g. aligned with) the first through third regions FR, SR and TR of the first substrate 110.

When viewing second substrate 210 from the top, the first region FR is defined at the center portion of the second substrate 210. For example, the first region FR has a transverse sectional shape and a surface area corresponding to those of the second semiconductor chip 220 which will be described later in detail.

The second region SR is defined around the first region FR in the shape of a rectangular band.

The second wiring lines 240 are disposed on the upper surface 211 of the second substrate 210. The second wiring lines 240 having a plural number extend, for example, from the first to region FR to the third region TR of the second substrate 210.

The second connection patterns 255 are disposed in the third region TR of the second substrate 210. In the present embodiment, the second connection patterns 255 are disposed on the lower surface 212 of the second substrate 210 facing the upper surface 111 of the first substrate 110. The second connection patterns 255 have the shape of a circular pad or a polygonal pad when viewed from the top. In the present embodiment, the second connection patterns 255, which are formed on the lower surface 212 of the second substrate 210, are disposed at positions that face the first connection patterns 154 of the first substrate 110.

The connection vias 255a pass through the lower surface 212 and the upper surface 211 of the second substrate 210 and are electrically connected to the second wiring lines 240.

In the present embodiment, the second wiring lines 240, and the second connection patterns 255 and the connection vias 255a, which correspond to the second wiring lines 240, are formed, for example, integrally with one another. Examples of a material that can be used to form the second wiring lines 240 and the second connection patterns 255 include copper, copper alloy, aluminum, and aluminum alloy.

The second semiconductor chip 220 is disposed, for example, in the first region FR on the upper surface 211 of the second substrate 210. In the present embodiment, the second semiconductor chip 220 can comprise, for example, a NAND memory chip. Alternatively, the second semiconductor chip 220 can comprise a system semiconductor chip.

The second semiconductor chip 220 includes a second circuit section (not shown), a plurality of second bonding pads 222, and a plurality of second bumps 224.

The second circuit section has a data storage unit (not shown) for storing data and a data processing unit (not shown) for processing data.

The second bonding pads 222 are electrically connected to the second circuit section. The second bonding pads 222 are disposed, for example, along the edges of the second semiconductor chip 220. The second bonding pads 222 are disposed at positions corresponding respectively to ends of the second wiring lines 240 disposed in the first region FR.

The second bumps 224 are interposed between the respective second bonding pads 222 and the respective second wiring lines 240 corresponding to the respective second bonding pads 222, by which the second bonding pads 222 and the second wiring lines 240 are connected to each other in the type of a flip chip.

The molding member 390 is disposed on the upper surface 211 of the second substrate 210. The molding member 390 covers the first region FR, the second region SR and the third region TR of the second substrate 210, and thereby, the second semiconductor chip 220 is covered by the molding member 390 in the first region FR.

Ball land patterns 260 are disposed on the lower surface 212 of the second substrate 210 and are electrically connected to the second connection patterns 255. Alternatively, the ball land patterns 260 can be electrically connected to the second wiring lines 240 through the second substrate 210.

The connectors 300 are interposed between the first semiconductor package 100 and the second semiconductor package 200. The connectors 300 electrically connect the first and second semiconductor packages 100 and 200 to each other.

Each connector 300 includes a connector body 310 and a conductive member 320.

The connector body 310 has the shape of, for example, a square column. The connector body 310 can be formed of an insulation material such as synthetic resin. The connector body 310 has a first surface 311 facing the lower surface 212 of the second substrate 210 and a second surface 312 facing the upper surface 111 of the first substrate 110. The connector body 310 further has a through-hole 313 which passes through the first surface 311 and the second surface 312. Through-holes 313 of connector bodies 310 are defined, for example, at positions corresponding to the respective first connection patterns 154 of the first substrate 110 and the respective second connection patterns 255 of the second substrate 210.

The conductive member 320 has the shape of a pin. The conductive member 320, which has the shape of a pin, is placed in the through-hole 313 defined in the connector body 310. Both ends of the conductive member 320 project out of the connector body 310.

One end (referred to as a first end) of each conductive member 320 is inserted into the hole of a corresponding first connection pattern 154 of the first substrate 110, and the other end (referred to as a second end) of each conductive member 320, facing away from the one end, is connected to the surface of each second connection pattern 255 of the second substrate 210.

The first end of the conductive member 320, which is inserted into the hole of the first connection pattern 154, can pass through the hole and project out of the lower surface 112 of the first substrate 110 by a predetermined distance. Alternatively, the one end of the conductive member 320, which is inserted into the hole of the first connection pattern 154, can be placed in the hole.

Connection members 330, which have a low melting point, are interposed respectively between the conductive members 320 and the first connection patterns 154 and between the conductive members 320 and the second connection patterns 255. The connection members 330 can comprise, for example, solders.

The stacked semiconductor package 400 according to the present embodiment can also include insulation members 350 each of which covers and insulates the first end of the conductive member 320. The insulation members 350 can be formed of, for example, synthetic resin such as epoxy resin or an organic material.

The gap-fill member 380 is interposed between the first semiconductor package 100 and the second semiconductor package 200. The gap-fill member 380 fills the gap between the first and second semiconductor chips 100 and 200. The gap-fill member 380 can be formed of an organic material or epoxy resin.

It was described in the aforementioned embodiments that the first and second semiconductor chips are connected with first and second wiring lines, for example, by the bumps, in the type of a flip chip. However, alternatively, it can be envisaged that the first and second semiconductor chips can be electrically connected to each other by conductive wires.

Also, in the aforementioned embodiments, in the case where the pad parts are formed on the connection patterns, it can be envisaged that a plurality of pad parts can be formed to be located radially relative to the connection patterns so that the contact area with respect to the connection members can be increased.

Further, in the aforementioned embodiments, in the case of stacked semiconductor packages in which first and second semiconductor packages are connected to each other using connectors, it can be envisaged that the connectors can be encapsulated by insulation members formed of epoxy resin so that the connectors can be prevented from being broken by external shocks.

Moreover, in the aforementioned embodiments, it can be contemplated that any one of the semiconductor chips included in the semiconductor packages can be selected by electrically connecting at least two conductive members of the connectors using the connection members.

Furthermore, in the aforementioned embodiments, it can be contemplated that junction members formed of a metal having a low melting point, such as solders, can be placed on both ends of the conductive members of the connectors, and the connection patterns and the conductive members of the connectors can be electrically connected with each other by fusing the junction members without using a separate connection metal.

In addition, in the aforementioned embodiments, the conductive members of the connectors can be formed in a manner such that they have a nickel layer and a gold layer which is placed on the nickel layer.

Also, in the aforementioned embodiments, the respective connection patterns can be placed in a zigzag pattern when viewed from the top, and according to this, the conductive members, which are formed in the connectors, can also be placed in a zigzag pattern in conformity with the placement of the connection patterns.

Also, in the aforementioned embodiments, metallic members can be placed on the surfaces of the connector bodies of the respective connectors so that the electromagnetic waves produced from the semiconductor chips can be intercepted and the heat dissipation characteristics can be improved.

Further, in the aforementioned embodiments, a metal having a low melting point, such as solders, can be placed on the surfaces of the connection patterns in the form of a thin film.

Moreover, in the aforementioned embodiments, isotropic conductive films, which contain conductive balls and resin, can be placed on the upper surfaces of the pad-shaped connection patterns.

Furthermore, in the aforementioned embodiments, recesses having an indented profile can be defined on the upper surfaces of the pad-shaped connection patterns so that the contact area between the connectors and the conductive members can be increased.

In addition, in the aforementioned embodiments, it is conceivable that the holes of the connection patterns can comprise taper holes and the conductive members of the connectors, which are inserted into the taper holes, can have a frusto-conical sectional shape.

Also, in the aforementioned embodiments, the ends of the conductive members of the connectors which are inserted into is the holes of the connection patterns can have a length that projects out of the molding member, and due to this fact, semiconductor packages can be stacked further by connecting another package to the conductive members.

As is apparent from the above description, in the present invention, by stacking at least two semiconductor packages and electrically connecting these semiconductor packages using the connectors having low electric resistance, it is possible to process data at a high speed using the respective semiconductor packages.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   a first semiconductor package comprising:
      a first substrate;
      a first semiconductor chip disposed on the first substrate, the first semiconductor chip having first bonding pads,
      a first molding member covering the first semiconductor chip;
      first wiring lines disposed on the first substrate and electrically connected to the first bonding pads, wherein the first wiring lines extend out of the first molding member, and first connection patterns electrically connected to the first wiring lines and disposed in first recesses defined in an upper surface of the first substrate;

a second semiconductor package comprising:

a second substrate disposed over the first substrate;

a second semiconductor chip disposed on an upper surface of the second substrate, the second semiconductor chip having second bonding pads;

a second molding member covering the second semiconductor chip;

second wiring lines disposed on the second substrate and electrically connected to the second bonding pads, wherein the second wiring lines extend out of the second molding member; and second connection patterns electrically connected to the second wiring lines and disposed in second recesses defined in a lower surface of the second substrate facing away from the upper surface and facing the first connection patterns; and a plurality of connectors each comprising:

a connector body interposed between the first and second semiconductor packages, the connector body including a through-hole defined at a position corresponding to a corresponding one of the first connection patterns and a corresponding one of the second connection patterns; and a conductive member inserted into the through-hole and is electrically connecting the corresponding one of the first connection patterns to the corresponding one of the second connection patterns, wherein the conductive member is disposed in the first and second recesses of the corresponding one of the first connection patterns and the corresponding one of the second connection patterns.

2. The stacked semiconductor package according to claim 1, wherein the first connection patterns have first pad parts which extend from the first recesses to the upper surface of the first substrate, and the second connection patterns have second pad parts which extend from the second recesses to the lower surface of the second substrate.

* * * * *